(12) United States Patent
Okano

(10) Patent No.: US 11,961,783 B2
(45) Date of Patent: Apr. 16, 2024

(54) SEMICONDUCTOR APPARATUS AND ELECTRONIC APPARATUS

(71) Applicant: SONY SEMICONDUCTOR SOLUTIONS CORPORATION, Kanagawa (JP)

(72) Inventor: Hitoshi Okano, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 88 days.

(21) Appl. No.: 17/609,906

(22) PCT Filed: Feb. 7, 2020

(86) PCT No.: PCT/JP2020/004823
§ 371 (c)(1),
(2) Date: Nov. 9, 2021

(87) PCT Pub. No.: WO2020/235148
PCT Pub. Date: Nov. 26, 2020

(65) Prior Publication Data
US 2022/0208642 A1  Jun. 30, 2022

(30) Foreign Application Priority Data

May 20, 2019 (JP) .................... 2019-094760

(51) Int. Cl.
*H01L 23/48* (2006.01)
*H01L 23/367* (2006.01)
*H01L 23/373* (2006.01)

(52) U.S. Cl.
CPC ........ *H01L 23/3735* (2013.01); *H01L 23/367* (2013.01)

(58) Field of Classification Search
CPC .............. H01L 23/3735; H01L 23/367; H01L 23/5286
See application file for complete search history.

(56) References Cited

U.S. PATENT DOCUMENTS 10,229,942 B2 * 3/2019 Oishi ............... H01L 27/14605
2004/0031004 A1   2/2004 Yoshioka
(Continued)

FOREIGN PATENT DOCUMENTS

CN          1790701 A     6/2006
CN        109585473 A     4/2019
(Continued)

OTHER PUBLICATIONS

International Search Report and Written Opinion of PCT Application No. PCT/JP2020/004823, dated Apr. 7, 2020, 09 pages of ISRWO.

*Primary Examiner* — Hoa B Trinh
(74) *Attorney, Agent, or Firm* — CHIP LAW GROUP

(57) ABSTRACT

To provide a semiconductor apparatus that makes it possible to further improve the efficiency in heat dissipation, and to provide an electronic apparatus that includes the semiconductor apparatus. A semiconductor apparatus is provided that includes a substrate, a plurality of chips each stacked on the substrate, and a plurality of guard rings each formed on an outer peripheral portion of a corresponding one of the plurality of chips to surround the corresponding one of the plurality of chips, in which at least portions of at least two of the plurality of guard rings are connected to each other through a thermally conductive material. Further, an electric apparatus is provided that includes the semiconductor apparatus.

17 Claims, 20 Drawing Sheets

(56) References Cited

U.S. PATENT DOCUMENTS

| | | | |
|---|---|---|---|
| 2006/0103017 A1 | 5/2006 | Usui et al. | |
| 2019/0103425 A1 | 4/2019 | Yoon et al. | |
| 2019/0386052 A1 | 12/2019 | Furuhashi | |
| 2023/0207398 A1* | 6/2023 | Or-Bach | H01L 21/76283 257/758 |

FOREIGN PATENT DOCUMENTS

| | | |
|---|---|---|
| CN | 110073492 A | 7/2019 |
| DE | 102018122234 A1 | 4/2019 |
| JP | 2004-072017 A | 3/2004 |
| JP | 2006-120996 A | 5/2006 |
| JP | 2006-140326 A | 6/2006 |
| JP | 2011-091152 A | 5/2011 |
| JP | 2012-156316 A | 8/2012 |
| JP | 2015-185818 A | 10/2015 |
| JP | 2018-101699 A | 6/2018 |
| JP | 2019-068049 A | 4/2019 |
| KR | 10-2019-0038031 A | 4/2019 |
| TW | 201909440 A | 3/2019 |
| WO | 2018/116559 A1 | 6/2018 |
| WO | 2019/021705 A1 | 1/2019 |

\* cited by examiner

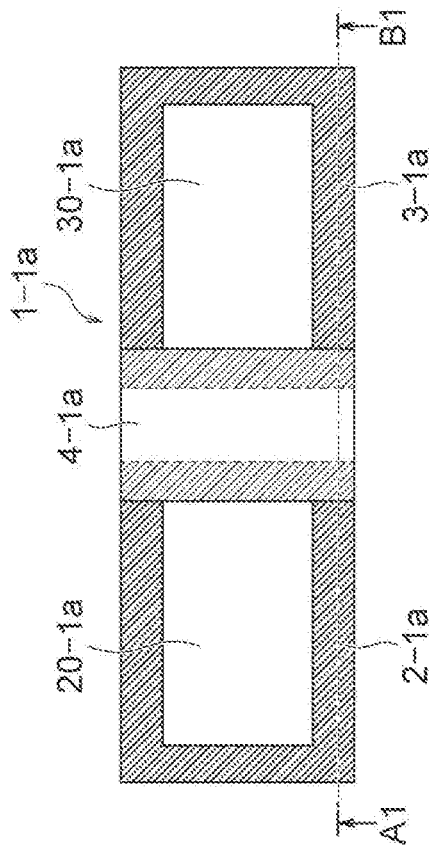
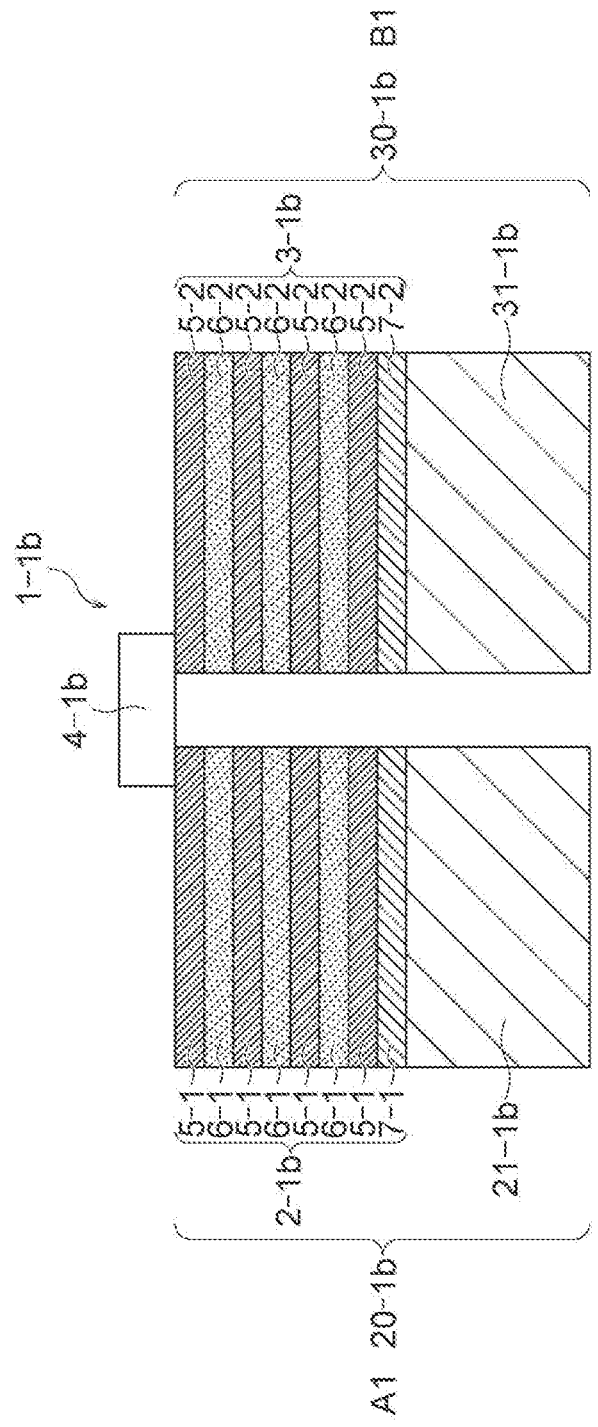
FIG. 1A
FIG. 1B

Table 1

| Material | Thermal conductivity/(Wm-1 K-1) |
|---|---|
| Carbon nanotube (C) | 3000 - 5500 |
| Diamond (C) | 1000 - 2000 |
| Silver (Ag) | 420 |
| Copper (Cu) | 398 |
| Gold (Au) | 320 |
| Aluminum (Al) | 236 |
| Silicon (Si) | 168 |
| Carbon (synthetic graphite, carbon) (C) | 100~250 |
| Aluminum nitride (AlN) | 150~250 |

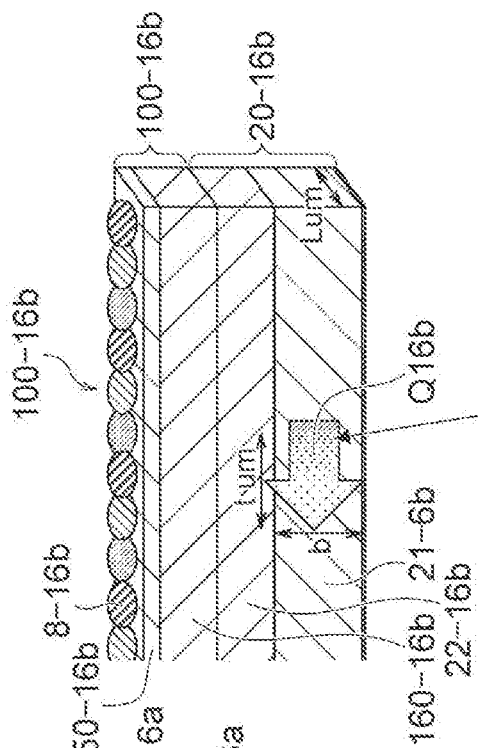
FIG. 16A
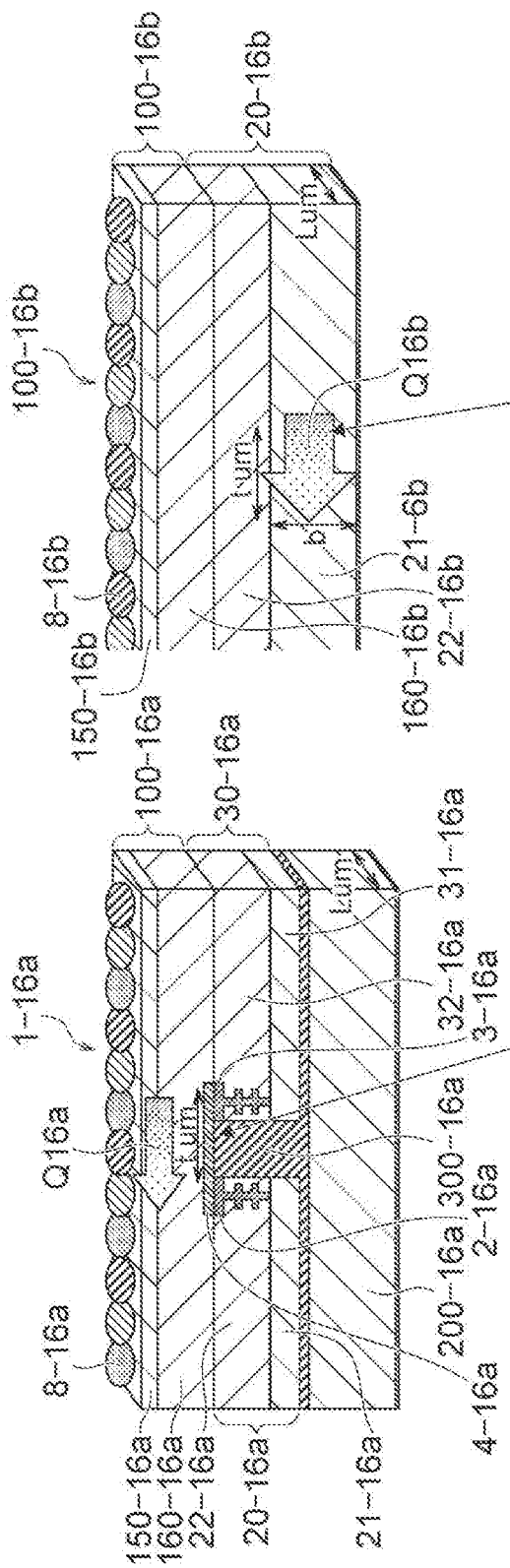
FIG. 16B
FIG. 16C
| | Connection using thermally conductive material (Cu) | Connection using thermally conductive material (Cu) and metal wiring | Si substrate (semiconductor substrate) |
|---|---|---|---|
| Thermal resistance (k/W) | 7.1E-3 × t/L | 1.9E-3 × t/L | 2.0E-3 × t/L |
| Area of contact (um²) | aum × Lum | 3.86aum × Lum | bum × Lum |

SEMICONDUCTOR APPARATUS AND ELECTRONIC APPARATUS

CROSS REFERENCE TO RELATED APPLICATIONS

This application is a U.S. National Phase of International Patent Application No. PCT/JP2020/004823 filed on Feb. 7, 2020, which claims priority benefit of Japanese Patent Application No. JP 2019-094760 filed in the Japan Patent Office on May 20, 2019. Each of the above-referenced applications is hereby incorporated herein by reference in its entirety.

TECHNICAL FIELD

The present technology relates to a semiconductor apparatus and an electronic apparatus.

BACKGROUND ART

In recent years, technologies used to make a semiconductor apparatus (for example, a solid-state imaging apparatus) smaller and denser have been actively developed. Under the circumstances of such a technical development, a technology related to the dissipation of heat generated during an operation of, for example, a signal processing circuit included in a semiconductor apparatus (for example, a solid-state imaging apparatus) has been proposed (for example, refer to Patent Literature 1).

CITATION LIST

Patent Literature

Patent Literature 1: Japanese Patent Application Laid-open No. 2012-156316

DISCLOSURE OF INVENTION

Technical Problem

However, there is a possibility that the efficiency in the heat dissipation in a semiconductor apparatus will not be further improved by the technology proposed in Patent Literature 1.

The present technology has been made in view of the circumstances described above, and it is a primary object of the present technology to provide a semiconductor apparatus that makes it possible to further improve the efficiency in heat dissipation, and an electronic apparatus that includes the semiconductor apparatus.

Solution to Problem

The inventors have conducted intensive researches in order to achieve the object described above. Consequently, the inventors have been successful in further improving the efficiency in the heat dissipation in a semiconductor apparatus, and have completed the present technology.

In other words, the present technology provides a semiconductor apparatus that includes a substrate, a plurality of chips each stacked on the substrate, and a plurality of guard rings each formed on an outer peripheral portion of a corresponding one of the plurality of chips to surround the corresponding one of the plurality of chips, in which at least portions of at least two of the plurality of guard rings are connected to each other through a thermally conductive material.

In the semiconductor apparatus according to the present technology, the thermally conductive material may be formed in the substrate.

In the semiconductor apparatus according to the present technology, a nitride film may be arranged between at least two of the plurality of chips that are adjacent to each other.

In the semiconductor apparatus according to the present technology, the thermally conductive material may be connected to dummy wiring that is formed in the chip surrounded by at least one of the at least two of the plurality of guard rings.

In the semiconductor apparatus according to the present technology, the thermally conductive material may be connected to dummy wiring that is formed in the substrate.

In the semiconductor apparatus according to the present technology, the thermally conductive material may be connected to metal wiring that is formed in the substrate.

In the semiconductor apparatus according to the present technology, the at least portions of the at least two of the plurality of guard rings may be connected to each other through through vias that each pass through the substrate, and the through via may include the thermally conductive material.

In the semiconductor apparatus according to the present technology, the at least portions of the at least two of the plurality of guard rings may be connected to each other through the thermally conductive material and bumps.

In the semiconductor apparatus according to the present technology, each of the plurality of chips may include a semiconductor substrate, and the semiconductor substrate may be connected to the guard ring.

In the semiconductor apparatus according to the present technology, the thermally conductive material may include at least one type selected from carbon nanotube, diamond, silver, copper, gold, aluminum, silicon, carbon, and aluminum nitride.

In the semiconductor apparatus according to the present technology, the substrate may include an imaging device that generates a pixel signal for each pixel, and at least one of the plurality of chips may include a signal processing circuit used to perform signal processing on the pixel signal.

In the semiconductor apparatus according to the present technology, the substrate may include a signal processing circuit, and at least one of the plurality of chips may include a signal processing circuit.

In the semiconductor apparatus according to the present technology, the plurality of chips may include a first chip and a second chip, the plurality of guard rings may include a first guard ring and a second guard ring, the first guard ring may be formed on an outer peripheral portion of the first chip to surround the first chip, the second guard ring may be formed on an outer peripheral portion of the second chip to surround the second chip, and the first guard ring and the second guard ring may be connected to each other through the thermally conductive material.

In the semiconductor apparatus according to the present technology, the plurality of chips may include a first chip, a second chip, and a third chip, the plurality of guard rings may include a first guard ring, a second guard ring, and a third guard ring, the first guard ring may be formed on an outer peripheral portion of the first chip to surround the first chip, the second guard ring may be formed on an outer peripheral portion of the second chip to surround the second chip, the third guard ring may be formed on an outer peripheral portion of the third chip to surround the third chip, the first guard ring and the second guard ring may be connected to each other through a first thermally conductive material, and the second guard ring and the third guard ring may be connected to each other through a second thermally conductive material.

Further, the present technology provides an electric apparatus that includes the semiconductor apparatus according to the present technology.

The present technology makes it possible to further improve the efficiency in the heat dissipation in a semiconductor apparatus. Note that the effect described here is not necessarily limitative, and any of the effects described in the present disclosure may be provided.

BRIEF DESCRIPTION OF DRAWINGS

FIGS. 1A and 1B illustrate an example of a configuration of a semiconductor apparatus to which the present technology is applied.

FIGS. 16A, 16B, and 16C are diagrams for describing an effect provided by the present technology.

MODE(S) FOR CARRYING OUT THE INVENTION

Figure 2A:
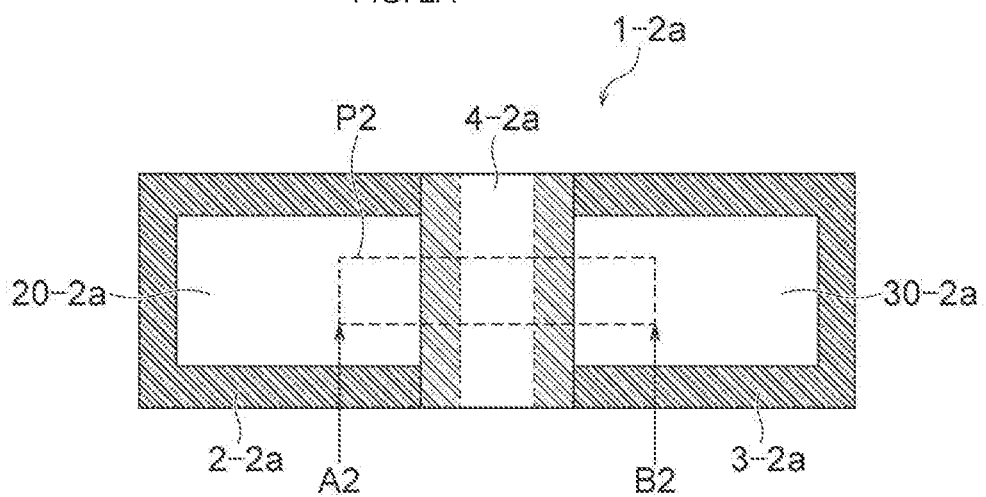
FIGS. 2A and 2B illustrate an example of a configuration of a semiconductor apparatus to which the present technology is applied.

Favorable embodiments for carrying out the present technology will now be described below. Embodiments described below are examples of representative embodiments of the present technology, and the scope of the present technology is not construed as being limited to the embodiments. Note that, in the drawings, "upper" refers to an upper direction or an upper side in the figures, "lower" refers to a lower direction or a lower side in the figures, "left" refers to a left direction or a left side in the figures, and "right" refers to a right direction or a right side in the figures, unless otherwise specified. Further, in the figures, similar or equivalent elements or members are denoted by a similar reference numeral to omit a repetitive description.

The description is made in the following order.
1. Overview of Present Technology
2. First Embodiment (First Example of Semiconductor Apparatus)
3. Second Embodiment (Second Example of Semiconductor Apparatus)
4. Third Embodiment (Third Example of Semiconductor Apparatus)
5. Fourth Embodiment (Fourth Example of Semiconductor Apparatus)
6. Fifth Embodiment (Fifth Example of Semiconductor Apparatus)
7. Sixth Embodiment (Sixth Example of Semiconductor Apparatus)
8. Seventh Embodiment (Seventh Example of Semiconductor Apparatus)
9. Eighth Embodiment (Eighth Example of Semiconductor Apparatus)
10. Ninth Embodiment (Ninth Example of Semiconductor Apparatus)
11. Tenth Embodiment (Example of Electronic Apparatus)
12. Example of Using Semiconductor Apparatus to Which Present Technology is Applied
13. Example of Application to Endoscopic Surgery System
14. Example of Application to Mobile Body 1. Overview of Present Technology First, an overview of the present technology is described.

An image sensor device in which a sensor chip is connected to a logic chip using, for example, copper (Cu) has started being commonly used. Note that, in the present technology, it is not limited to a logic chip, and any chip including a signal processing circuit may be used. The same applies to the following descriptions. The logic chip includes various circuits used to process a signal from the sensor chip, such as a memory circuit and an analog circuit. Further, there is another device that has a structure in which a plurality of logic chips is provided to a sensor chip using bump connections. The bump connection is a factor in preventing a device from being made smaller due to its wide pitch. It is expected that, in the future, the bump connection used to connect a plurality of chips will be replaced by a connection using copper (Cu), taking advantage of properties of both of the devices. However, when a plurality of logic chips is bonded as in the case of a bump connection, heat that is generated during an operation of a circuit and equalized by a semiconductor substrate (an Si substrate) of a logic chip is divided for respective individual chips, and this results in different chip temperatures. This may affect properties of a connected sensor chip.

For example, there is a technology related to the efficiency in heat dissipation between chips. This technology is capable of reducing a difference in temperature using, as an intermediate, a highly thermally conductive material filled into a space between chips obtained by performing dicing. Further, there is also a method performed using a commonly used resin filler or adhesive material, but it is doubtful that such a method has an affinity for, for example, heat treatment performed during the process of stacking a large number of chips.

An imager sensor that deals with the quantum of electrons has a property of being sensitive to temperature. For example, a non-uniform image is obtained due to the temperature in a chip being changed by several degrees C. The amount of heat generated by a logic chip differs depending on an included circuit and an operation speed. For example, there is a possibility that the temperature of a logic chip with a power of 2 W will be increased to 59° C. at an ambient temperature of 45° C. When a plurality of logic chips is bonded to a sensor chip, there may be a chip of which a temperature is increased by several tens of degrees C., as described above. This results in there being a need to take measures to reduce a difference in temperature between chips. The following is an example of the measures to be taken. When a connection-target chip is cut into pieces by performing dicing (using, for example, a blade or a laser), as in the case of the technology described above, the end of an obtained chip has an uneven surface. Thus, there is a need to thickly form a (highly) thermally conductive material (thermally conductive layer) that will be in contact with the obtained chip. However, the formation of a thick material prevents a gap between the chips from being made narrow since the gap is a dead space. Further, this end surface has a thermal conductivity that is different from the normal thermal conductivity of Si. This may result in reducing the efficiency. Furthermore, it is favorable that a chip (such as a semiconductor substrate) have a smaller thickness in order to, for example, fill a gap between chips. In this case, there is a reduction in the area of contact between a semiconductor substrate (an Si layer) having a small thickness, and a (highly) thermally conductive material, and this may result in reducing the efficiency in thermal conductivity.

The present technology has been made in view of the circumstances described above.

The present technology uses a guard ring that is formed on an outer peripheral portion of a chip to surround the chip. The guard ring is provided in the form of a wall that is continuous from a semiconductor substrate (such as an Si substrate) to the BEOL, as viewed from an end of a chip, in order to reduce damage upon dicing and to prevent moisture from entering from the surroundings. When the guard ring is connected to a thermally conductive material to conduct heat, this results in improving the thermal conductivity between chips (for example, between a first chip and a second chip), and in reducing a difference in temperature between the chips. Consequently, temperatures of a plurality of chips (such as the first chip and the second chip) can be equalized.

Further, the present technology primarily relates to a semiconductor apparatus. In particular, the present technology relates to a semiconductor apparatus that includes a substrate, a plurality of chips each stacked on the substrate, and a plurality of guard rings each formed on an outer peripheral portion of a corresponding one of the plurality of chips to surround the corresponding one of the plurality of chips, in which at least portions of at least two of the plurality of guard rings are connected to each other through a thermally conductive material. In the semiconductor apparatus according to the present technology, at least two chips from among the plurality of chips may be thermally connected to each other. Here, the expression "two chips may be thermally connected to each other" means that heat can be transferred between two chips through a thermally conductive material and guard rings.

Note that the substrate included in the semiconductor apparatus according to the present technology may be a substrate that includes an imaging device that generates a pixel signal for each pixel, or a substrate that includes a signal processing circuit (such as a logic circuit, a DSP circuit, a memory circuit, and a CPU circuit), or a substrate that includes a MEMS element, or a substrate that includes a thermoelectric generation element. Likewise, the chip included in the semiconductor apparatus according to the present technology may be a chip that includes an imaging device that generates a pixel signal for each pixel, or a chip that includes a signal processing circuit (such as a logic circuit, a DSP circuit, a memory circuit, and a CPU circuit), or a chip that includes a MEMS element, or a chip that includes a thermoelectric generation element. Further, a material that is included in the thermally conductive material may be any material having a thermal conductivity. For example, the material included in the thermally conductive material may be a conductive material or a non-conductive material.

According to the present technology, a solid-state imaging apparatus having a stacking structure in which a substrate and a plurality of chips are stacked can provide a thermal resistance performance substantially similar to a thermal resistance performance of a solid-state imaging apparatus having a stacking structure in which a single chip and a single chip are stacked (or a stacking structure in which a chip and a substrate are stacked). Since current does not flow through a guard ring or a thermally conductive material, the sensor properties are not affected by the electric field or the magnetic field, and thus there is no need for a shield. Further, guard rings that are respectively provided at ends of adjacent chips are connected to each other, and this enables a connection in a distance shorter than a distance in which wiring in a chip is connected to wiring in another chip. This makes it possible to further reduce the thermal resistance. Furthermore, when a guard ring is used, the area of contact from a semiconductor substrate (an Si substrate) to the BEOL is larger, compared to when normal wiring is adopted. This makes it possible to further reduce the thermal resistance.

Next, a semiconductor apparatus according to the present technology is specifically described using FIGS. 1A, 1B, 2A, 2B, 16A, 16B, and 16C.

FIGS. 1A and 1B illustrate an example of a configuration of a semiconductor apparatus according to the present technology. Specifically, FIG. 1A is a top view of a semiconductor apparatus 1-1a, where an illustration of a substrate is omitted (a plan layout diagram of a first chip 20-1a and a second chip 30-1a), and FIG. 1B is a cross-sectional view of the semiconductor apparatus 1-1b along the line A1-B1 illustrated in FIG. 1A, where an illustration of a substrate is omitted.

As illustrated in FIG. 1A, the semiconductor apparatus 1-1a includes the first chip 20-1a (on the left in FIG. 1A) and the second chip 30-1a (on the right in FIG. 1A), where a first guard ring 2-1a is formed on an outer peripheral portion of the first chip 20-1a to surround the first chip 20-1a, and a second guard ring 3-1a is formed on an outer peripheral portion of the second chip 30-1a to surround the second chip 30-1a. A right side of the first guard ring 2-1a (on the right in FIG. 1A and on a side adjacent to the second guard ring 3-1a) and a left side of the second guard ring 3-1a (on the left in FIG. 1A and on a side adjacent to the first guard ring 2-1a) are connected to each other through a thermally conductive material 4-1a.

Figure 2B:
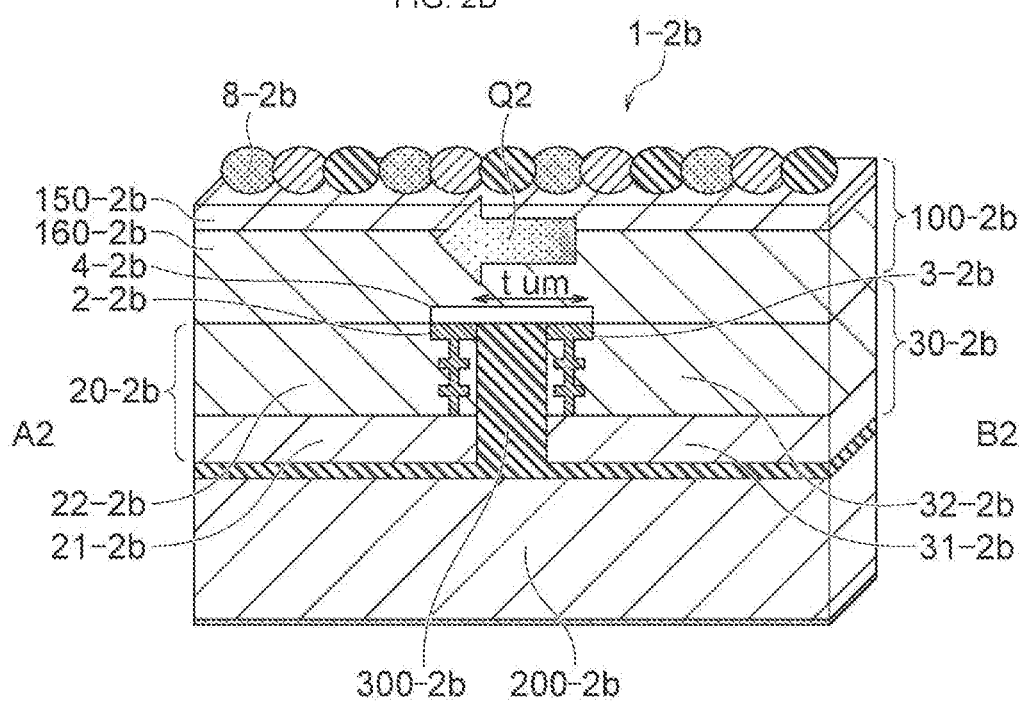

As illustrated in FIG. 1B, the first guard ring 2-1b is stacked on a semiconductor substrate 21-1b around the outer peripheral portion of the first chip 20-1b included in the semiconductor apparatus 1-1b, and the semiconductor substrate 21-1b and the first guard ring 2-1b are connected to each other. Further, the second guard ring 3-1b is stacked on a semiconductor substrate 31-1b around the outer peripheral portion of the second chip 30-1b included in the semiconductor apparatus 1-1b, and the semiconductor substrate 31-1b and the second guard ring 3-1b are connected to each other. In FIG. 1B, the first guard ring 2-1b is formed by stacking a tungsten via 7-1; a metal 5-1 and a via 6-1 that are repeatedly stacked three times; and the metal 5-1 in this order from a stacking surface (a connection surface) of the semiconductor substrate 21-1b and the first guard ring 2-1b. The second guard ring 3-1b is formed by stacking a tungsten via 7-2; a metal 5-2 and a via 6-2 that are repeatedly stacked three times; and the metal 5-2 in this order from a stacking surface (a connection surface) of the semiconductor substrate 31-1b and the first guard ring 3-1b. In FIG. 1B, a portion of a region of the metal 5-1 in an uppermost layer of the first guard ring 2-1b and a portion of a region of the metal 5-2 in an uppermost layer of the second guard ring 3-1b are connected to each other through the thermally conductive material 4-1b. Note that the entirety of the region of the metal 5-1 in a right-and-left direction of FIG. 1B in the uppermost layer of the first guard ring 2-1b, and the entirety of the region of the metal 5-2 in the right-and-left direction of FIG. 1B in the uppermost layer of the second guard ring 3-1b may be connected to each other through the thermally conductive material 4-1b FIGS. 2A and 2B illustrate an example of a configuration of a semiconductor apparatus according to the present technology. Specifically, FIG. 2A is a top view of a solid-state imaging apparatus 1-2a that is an example of the semiconductor apparatus, where an illustration of a substrate is omitted (a plan layout diagram of a first chip 20-2a and a second chip 30-2a), and FIG. 2B is a perspective cross-sectional view of the solid-state imaging apparatus 1-2b that is the example of the semiconductor apparatus, and corresponds to a portion P2 indicated by an arrow A2 and an arrow B2 illustrated in FIG. 2A.

As illustrated in FIG. 2A, the semiconductor apparatus 1-2a includes the first chip 20-2a (on the left in FIG. 2A) and the second chip 30-2a (on the right in FIG. 2A), where a first guard ring 2-2a is formed on an outer peripheral portion of the first chip 20-2a to surround the first chip 20-2a, and a second guard ring 3-2a is formed on an outer peripheral portion of the second chip 30-2a to surround the second chip 30-2a. A right side of the first guard ring 2-2a (on the right in FIG. 2A and on a side adjacent to the second guard ring 3-2a) and a left side of the second guard ring 3-2a (on the left in FIG. 2A and on a side adjacent to the first guard ring 2-2a) are connected to each other through a thermally conductive material 4-2a.

As illustrated in FIG. 2B, the solid-state imaging apparatus 1-2b includes a substrate 100-2b, and the first chip 20-2b (a chip on the left in FIG. 2B) and the second chip 30-2b (a chip on the right in FIG. 2B) each being stacked on the substrate 100-2b (stacked downward in FIG. 2B).

The substrate 100-2b includes an imaging device that generates a pixel signal for each pixel. Specifically, the substrate 100-2b includes a solid-state imaging device 150-2b and a wiring layer 160-2b, the solid-state imaging device 150-2b including a semiconductor substrate (not illustrated) and a photoelectric converter (not illustrated) that is formed in the semiconductor substrate. Further, a color filter and an on-chip lens 8-2b are formed on the solid-state imaging device 150-2b. The first chip 20-2b includes a semiconductor substrate 21-2b and a wiring layer 22-2b, and a signal processing circuit such as a memory circuit is formed in the semiconductor substrate 21-2b. Further, the second chip 30-2b includes a semiconductor substrate 31-2b and a wiring layer 32-2b, and a signal processing circuit such as a logic circuit is formed in the semiconductor substrate 31-2b. In FIG. 2B, the first chip 20-2b and the second chip 30-2b are formed downward on the substrate 100-2b in substantially the same layer (at the same level), where the thickness of the wiring layer 22-2b (the length of the wiring layer 22-2b in an up-and-down direction in FIG. 2B) and the thickness of the wiring layer 32-2b (the length of the wiring layer 32-2b in the up-and-down direction in FIG. 2B) are substantially the same as each other, and the thickness of the semiconductor substrate 21-2b (the length of the semiconductor substrate 21-2b in the up-and-down direction in FIG. 2B) and the thickness of the semiconductor substrate 31-2b (the length of the semiconductor substrate 31-2b in the up-and-down direction in FIG. 2B) are substantially the same as each other. A support substrate 200-2b is stacked under the first chip 20-2b and the second chip 30-2b (on a lower side of the first chip 20-2b and the second chip 30-2b in FIG. 2B). In order to prevent humification, a nitride film 300-2b is arranged between the first chip 20-2b and the second chip 30-2b, between the first chip 20-2b and the support substrate 200-2b, and between the second chip 30-2b and the support substrate 200-2b.

The substrate 100-2b and the first chip 20-2b are stacked such that the wiring layer 160-2b included in the substrate 100-2b faces the wiring layer 22-2b included in the first chip 20-2b, and the substrate 100-2b and the second chip 30-2b are stacked such that the wiring layer 160-2b included in the substrate 100-2b faces the wiring layer 32-2b included in the second chip 30-2b. The thermally conductive material 4-2b made of, for example, copper (Cu) is formed in the wiring layer 160-2b included in the substrate 100-2b. The first guard ring 2-2b is formed (only a portion of the first guard ring 2-2b is illustrated in FIG. 2B) on an outer portion of the wiring layer 22-2b included in the first chip 20-2b (at a right end of the wiring layer 22-2b in FIG. 2B), and the first guard ring 2-2b is connected to the semiconductor substrate 21-2b. Further, the second guard ring 3-2b is formed (only a portion of the second guard ring 3-2b is illustrated in FIG. 2B) on an outer portion of the wiring layer 32-2b included in the second chip 30-2b (at a left end of the wiring layer 32-2b in FIG. 2B), and the second guard ring 3-2b is connected to the semiconductor substrate 31-2b. The first guard ring 2-2b and the second guard ring 3-2b being adjacent to each other are connected to each other through the thermally conductive material 4-2b. Thus, the semiconductor substrate 21-2b, the first guard ring 2-2b, the thermally conductive material 4-2b, the second guard ring 3-2b, and the semiconductor substrate 31-2b are connected to each other, and heat generated by, for example, the second chip 30-2b including a logic circuit is transferred to, for example, the first chip 20-2b including a memory circuit with a heat transfer length of t μm (a length of a heat transfer from a heat generation source) in a direction of an arrow Q2. This may result in reducing a difference in temperature between the first chip 20-2b and the second chip 30-2b.

FIGS. 16A, 16B, 16C, and 16D are diagrams for describing an effect provided by the present technology. Specifically, FIG. 16A is a perspective cross-sectional view illustrating an example of a configuration of a solid-state imaging apparatus that is an example of the semiconductor apparatus according to the present technology, and FIG. 16B is a perspective cross-sectional view illustrating an example of a configuration of a solid-state imaging apparatus. Further, FIG. 16C illustrates a result of comparing thermal resistances (k/W) of three types of solid-state imaging apparatuses in total that are the solid-state imaging apparatus illustrated in FIG. 16A, a solid-state imaging apparatus according to the present technology that is not illustrated, and the solid-state imaging apparatus illustrated in FIG. 16B.

As illustrated in FIG. 16A, a solid-state imaging apparatus 1-16a includes a substrate 100-16a, and a first chip 20-16a (a chip on the left in FIG. 16A) and a second chip 30-16a (a chip on the right in FIG. 16A) that are each stacked on the substrate 100-16a (stacked downward in FIG. 16A).

The substrate 100-16a includes an imaging device that generates a pixel signal for each pixel. Specifically, the substrate 100-16a includes a solid-state imaging device 150-16a and a wiring layer 160-16a, the solid-state imaging device 150-16a including a semiconductor substrate (not illustrated) and a photoelectric converter (not illustrated) that is formed in the semiconductor substrate. Further, a color filter and an on-chip lens 8-16a are formed on the solid-state imaging device 150-16a. The first chip 20-16a includes a semiconductor substrate 21-16a and a wiring layer 22-16a, and a signal processing circuit such as a memory circuit is formed in the semiconductor substrate 21-16a. Further, the second chip 30-16a includes a semiconductor substrate 31-16a and a wiring layer 32-16a, and a signal processing circuit such as a logic circuit is formed in the semiconductor substrate 31-16a. In FIG. 16A, the first chip 20-16a and the second chip 30-16a are formed downward on the substrate 100-16a in substantially the same layer (at the same level), where the thickness of the wiring layer 22-16a (the length of the wiring layer 22-16a in an up-and-down direction in FIG. 16A) and the thickness of the wiring layer 32-16a (the length of the wiring layer 32-16a in the up-and-down direction in FIG. 16A) are substantially the same as each other, and the thickness of the semiconductor substrate 21-16a (the length of the semiconductor substrate 21-16a in the up-and-down direction in FIG. 16A) and the thickness of the semiconductor substrate 31-16a (the length of the semiconductor substrate 31-16a in the up-and-down direction in FIG. 16A) are substantially the same as each other. A support substrate 200-16a is stacked under the first chip 20-16a and the second chip 30-16a (on a lower side of the first chip 20-16a and the second chip 30-16a in FIG. 16A). In order to prevent humification, a nitride film 300-16a is arranged between the first chip 20-16a and the second chip 30-16a, between the first chip 20-16a and the support substrate 200-16a, and between the second chip 30-16a and the support substrate 200-16a.

The substrate 100-16a and the first chip 20-16a are stacked such that the wiring layer 160-16a included in the substrate 100-16a faces the wiring layer 22-16a included in the first chip 20-16a, and the substrate 100-16a and the second chip 30-16a are stacked such that the wiring layer 160-16a included in the substrate 100-16a faces the wiring layer 32-16a included in the second chip 30-16a. A thermally conductive material 4-16a made of, for example, copper (Cu) is formed in the wiring layer 160-16a included in the substrate 100-16a. A first guard ring 2-16a is formed (only a portion of the first guard ring 2-16a is illustrated in FIG. 16A) on an outer portion of the wiring layer 22-16a included in the first chip 20-16a (at a right end of the wiring layer 22-16a in FIG. 16A), and the first guard ring 2-16a is connected to the semiconductor substrate 21-16a. Further, a second guard ring 3-16a is formed (only a portion of the second guard ring 3-16a is illustrated in FIG. 16A) on an outer portion of the wiring layer 32-16a included in the second chip 30-16a (at a left end of the wiring layer 32-16a in FIG. 16A), and the second guard ring 3-16a is connected to the semiconductor substrate 31-16a. The first guard ring 2-16a and the second guard ring 3-16a being adjacent to each other are connected to each other through the thermally conductive material 4-16a. Thus, the semiconductor substrate 21-16a, the first guard ring 2-16a, the thermally conductive material 4-16a, the second guard ring 3-16a, and the semiconductor substrate 31-16a are connected to each other, and heat generated by, for example, the second chip 30-16a including a logic circuit is transferred to, for example, the first chip 20-16a including a memory circuit with a heat transfer length of t μm (a length of a heat transfer from a heat generation source) in a direction of an arrow Q16a. This may result in reducing a difference in temperature between the first chip 20-16a and the second chip 30-16a.

As illustrated in of FIG. 16B, a solid-state imaging apparatus 1-16b includes a substrate 100-16b (or may include a chip 100-16b, and the same applies to the following descriptions), and a chip 20-16b that is stacked on the substrate 100-16b (stacked downward in FIG. 16B).

The substrate 100-16b includes an imaging device that generates a pixel signal for each pixel. Specifically, the substrate 100-16b includes a solid-state imaging device 150-16b and a wiring layer 160-16b, the solid-state imaging device 150-16b including a semiconductor substrate (not illustrated) and a photoelectric converter (not illustrated) that is formed in the semiconductor substrate. Further, a color filter and an on-chip lens 8-16b are formed on the solid-state imaging device 150-16b. The chip 20-16b includes a semiconductor substrate 21-16b and a wiring layer 22-16b, and a signal processing circuit such as a logic circuit is formed in the semiconductor substrate 21-16b.

The substrate 100-16b and the chip 20-16b are stacked such that the wiring layer 160-16b included in the substrate 100-16b faces the wiring layer 22-16b included in the chip 20-16b. Heat generated by, for example, the second chip 30-16b including a logic circuit passes through the chip 20-16b with a heat transfer length of t μm (a length of a heat transfer from a heat generation source) in a direction of an arrow Q16b.

As illustrated in FIG. 16C, the thermal resistance (k/W) of the solid-state imaging apparatus 1-16a when the area of contact exhibits a value obtained by "a μm (the thickness of the thermally conductive material (for example, Cu) 4-16a) =L μm (the width of the solid-state imaging apparatus 1-16a (the length from a front surface to a back surface in depth in FIG. 16A))", is obtained by 7.1 E-3=t/L. The thermal resistance (k/W) of a solid-state imaging apparatus that uses a thermally conductive material (Cu) and connection metal wiring for the thermally conductive material, and has substantially the same stacking structure as the solid-state imaging apparatus 1-16a when the area of contact exhibits a value obtained by "3.86a μm (the thickness of the thermally conductive material (for example, Cu)+the thickness of the metal wiring)=L μm (the width of the solid-state imaging apparatus (the length from a front surface to a back surface of the solid-state imaging apparatus in depth))", is obtained by 1.9E-3=t/L, although this solid-state imaging apparatus is not illustrated. Further, the thermal resistance (k/W) of the solid-state imaging apparatus 1-16b when the area of contact exhibits a value obtained by "b μm (the thickness of the semiconductor substrate 21-6b)=L μm (the width of the solid-state imaging apparatus 1-16b (the length from a front surface to a back surface in depth in FIG. 16B))", is obtained by 2.0E-3=t/L. This result shows that a solid-state imaging apparatus having a stacking structure in which a substrate and a plurality of chips (two chips in FIG. 16A) are stacked, has a thermal resistance substantially equal to the thermal resistance of a solid-state imaging apparatus having a stacking structure in which a single chip and single chip are stacked (or a stacking structure in which a chip and a substrate are stacked).

Embodiments According to the Present Technology are Described in Detail Below

2. First Embodiment (First Example of Semiconductor Apparatus)

Figure 3A:
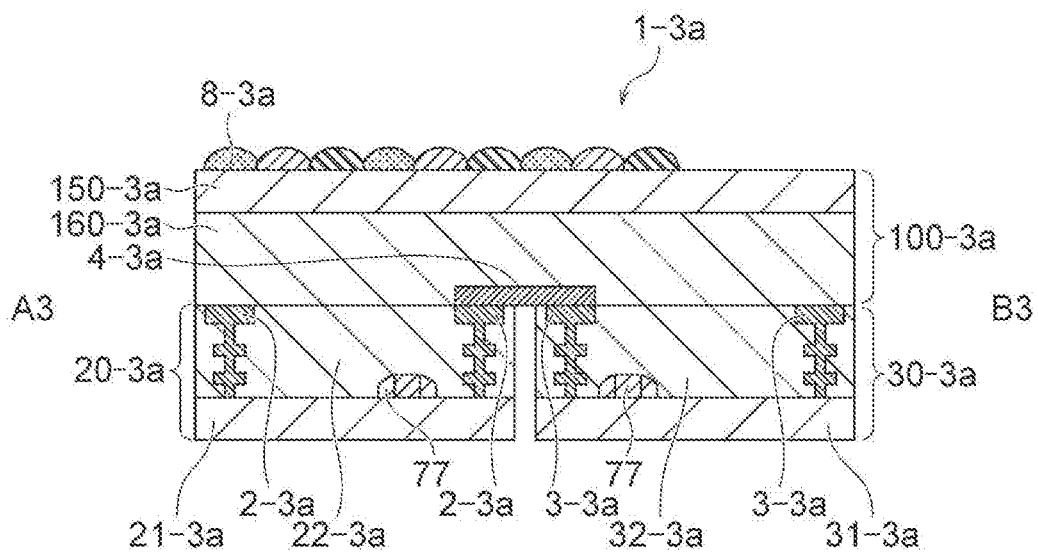
FIGS. 3A and 3B illustrate an example of a configuration of a semiconductor apparatus of a first embodiment to which the present technology is applied.
Figure 3B:
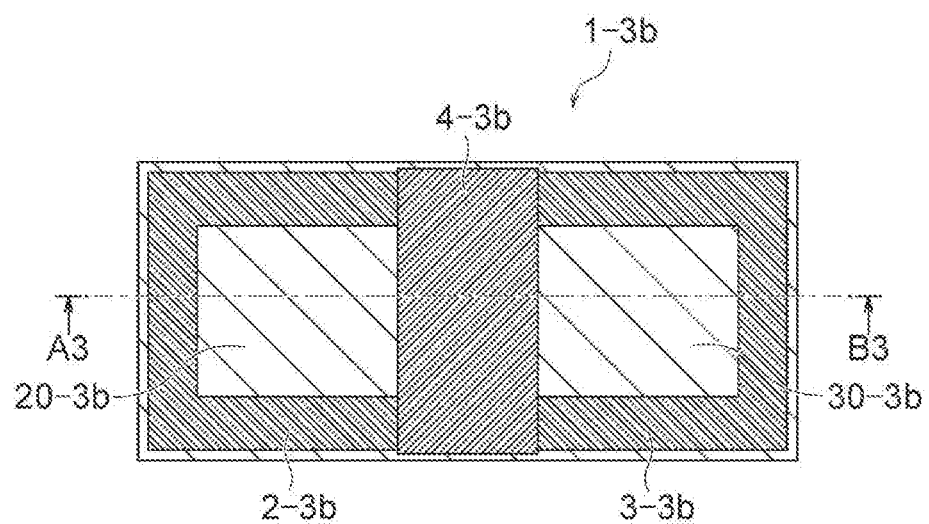

A semiconductor apparatus of a first embodiment according to the present technology (a first example of a semiconductor apparatus) is described using FIGS. 3A, 3B, 12, 13A, 13B, 13C, 13D, 14A, 14B, 14C, and 14D. FIGS. 3A and 3B illustrate an example of a configuration of the semiconductor apparatus of the first embodiment according to the present technology. Specifically, FIG. 3A is a cross-sectional view of a solid-state imaging apparatus 1-3a that is taken along the line A3-B3 illustrated in FIG. 3B, the solid-state imaging apparatus 1-3a being an example of the semiconductor apparatus of the first embodiment according to the present technology, and FIG. 3B is a top view of the solid-state imaging apparatus 1-3b that is the example of the semiconductor apparatus, where a substrate 100-3a illustrated in FIG. 3A is not illustrated (a plan layout diagram of a first chip 20-3b and a second chip 30-3b).

First, the description is made using FIG. 3A. The solid-state imaging apparatus 1-3a includes the substrate 100-3a, and the first chip 20-3a and the second chip 30-3a each being stacked on the substrate 100-3a (stacked downward in FIG. 3A).

The substrate 100-3a includes an imaging device that generates a pixel signal for each pixel. Specifically, the substrate 100-3a includes a solid-state imaging device 150-3a and a wiring layer 160-3a, the solid-state imaging device 150-3a including a semiconductor substrate (not illustrated) and a photoelectric converter (not illustrated) that is formed in the semiconductor substrate. Further, a color filter and an on-chip lens 8-3a are formed on the solid-state imaging device 150-3a. The first chip 20-3a includes a semiconductor substrate 21-3a and a wiring layer 22-3a, and a signal processing circuit such as a logic circuit is formed in the semiconductor substrate 21-3a. Further, the second chip 30-3a includes a semiconductor substrate 31-3a and a wiring layer 32-3a, and a signal processing circuit such as a memory circuit is formed in the semiconductor substrate 31-3a. In FIG. 3A, the first chip 20-3a and the second chip 30-3a are formed downward on the substrate 100-3a in substantially the same layer (at the same level), where the thickness of the wiring layer 22-3a (the length of the wiring layer 22-3a in an up-and-down direction in FIG. 3A) and the thickness of the wiring layer 32-3a (the length of the wiring layer 32-3a in the up-and-down direction in FIG. 3A) are substantially the same as each other, and the thickness of the semiconductor substrate 21-3a (the length of the semiconductor substrate 21-3a in the up-and-down direction in FIG. 3A) and the thickness of the semiconductor substrate 31-3a (the length of the semiconductor substrate 31-3a in the up-and-down direction in FIG. 3A) are substantially the same as each other. An element 77 formed in each of the semiconductor substrates 21-3a and 31-3a represents, for example, a transistor (the same applies to a figure other than FIG. 3A in the following descriptions).

The substrate 100-3a and the first chip 20-3a are stacked such that the wiring layer 160-3a included in the substrate 100-3a faces the wiring layer 22-3a included in the first chip 20-3a, and the substrate 100-3a and the second chip 30-3a are stacked such that the wiring layer 160-3a included in the substrate 100-3a faces the wiring layer 32-3a included in the second chip 30-3a. A thermally conductive material 4-3a made of, for example, copper (Cu) is formed in the wiring layer 160-3a included in the substrate 100-3a. A first guard ring 2-3a is formed on an outer portion of the wiring layer 22-3a included in the first chip 20-3a (at left and right ends of the wiring layer 22-3a in FIG. 3A), and the first guard ring 2-3a is connected to the semiconductor substrate 21-3a. Further, a second guard ring 3-3a is formed on an outer portion of the wiring layer 32-3a included in the second chip 30-3a (at left and right ends of the wiring layer 32-3a in FIG. 3A), and the second guard ring 3-3a is connected to the semiconductor substrate 31-3a. A portion of the first guard ring 2-3a of the first chip 20-3a that is formed on a side adjacent to the second chip 30-3a (on the right in FIG. 3A), and a portion of the second guard ring 3-3a of the second chip 30-3a that is formed on a side adjacent to the first chip 20-3a (on the left in FIG. 3A) are connected to each other through the thermally conductive material 4-3a. Thus, the semiconductor substrate 21-3a, the first guard ring 2-3a, the thermally conductive material 4-3a, the second guard ring 3-3a, and the semiconductor substrate 31-3a are connected to each other. This may result in reducing a difference in temperature between the first chip 20-3a and the second chip 30-3a.

The description is made using FIG. 3B. As illustrated in FIG. 3B, the solid-state imaging apparatus 1-3b includes the first chip 20-3b (on the left in FIG. 3B) and the second chip 30-3b (on the right in FIG. 3B), where the first guard ring 2-3b is formed on an outer peripheral portion of the first chip 20-3b to surround the first chip 20-3b, and the second guard ring 3-3b is formed on an outer peripheral portion of the second chip 30-3b to surround the second chip 30-3b. A right side of the first guard ring 2-3b (on the right in FIG. 3B and on a side adjacent to the second guard ring 3-3b) and a left side of the second guard ring 3-3b (on the left in FIG. 3B and on a side adjacent to the first guard ring 2-3b) are connected to each other through the thermally conductive material 4-3b. In other words, in FIG. 3B, the thermally conductive material 4-3b is joined to (is in contact with) an entire region of the right side of the first guard ring 2-3b and an entire region of the left side of the second guard ring 3-3b.

Figures 11, 12:
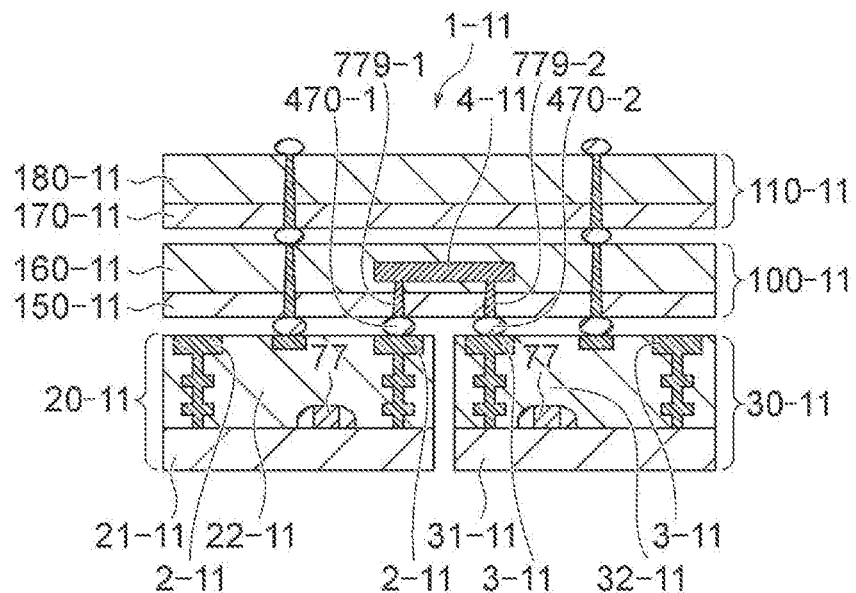
FIG. 11 illustrates an example of a configuration of a semiconductor apparatus of a ninth embodiment to which the present technology is applied.
FIG. 12 illustrates an example of a thermally conductive material included in the semiconductor apparatus to which the present technology is applied.

Next, the semiconductor apparatus of the first embodiment according to the present technology (the first example of the semiconductor apparatus) is described using FIG. 12. FIG. 12 illustrates an example of a thermally conductive material included in the semiconductor apparatus of the first embodiment according to the present technology. Specifically, FIG. 12 illustrates a specific material of a thermally conductive material used in the semiconductor apparatus of the first embodiment according to the present technology, and the thermal conductivity $Wm^{-1}K^{-1}$ of the specific material. Note that the specific material of the thermally conductive material illustrated in FIG. 12 may be used in semiconductor apparatuses of second to ninth embodiments according to the present technology that will be described later, unless there is a technical inconsistency in particular.

Examples of the specific material of the thermally conductive material include carbon nanotube (C), diamond (C), silver (Ag), copper (Cu), gold (Au), aluminum (Al), silicon (Si), carbon (C) (synthetic graphite, carbon), and aluminum nitride (AlN), as illustrated in FIG. 12. Further, as illustrated in FIG. 12, carbon nanotube (C) has a thermal conductivity of between 3000 and 5500 $Wm^{-1}K^{-1}$, diamond (C) has a thermal conductivity of between 1000 and 2000 $Wm^{-1}K^{-1}$, silver (Ag) has a thermal conductivity of 420 $Wm^{-1}K^{-1}$, copper (Cu) has a thermal conductivity of 398 $Wm^{-1}K^{-1}$, gold (Au) has a thermal conductivity of 320 $Wm^{-1}K^{-1}$, aluminum (Al) has a thermal conductivity of 236 $Wm^{-1}K^{-1}$, silicon (Si) has a thermal conductivity of 168 $Wm^{-1}K^{-1}$, carbon (C) (synthetic graphite, carbon) has a thermal conductivity of between 100 and 250 $Wm^{-1}K^{-1}$, and aluminum nitride (AlN) has a thermal conductivity of between 150 and 250 $Wm^{-1}K^{-1}$. The material of the thermally conductive material is selected depending on the purpose and the application in consideration of, for example, the magnitude of the thermal conductivity, and being conductive or non-conductive.

FIGS. 13A, 13B, 13C, 13D, 14A, 14B, 14C, 14D, and 15 are diagrams for describing a method for manufacturing the semiconductor apparatus of the first embodiment according to the present technology (the first example of the semiconductor apparatus). Specifically, FIGS. 13A, 13B, 13C, 13D, 14A, 14B, 14C, 14D, and 15 are diagrams for describing a method for manufacturing a solid-state imaging apparatus 1-15 that is an example of the semiconductor apparatus of the first embodiment according to the present technology.

Figure 13A:
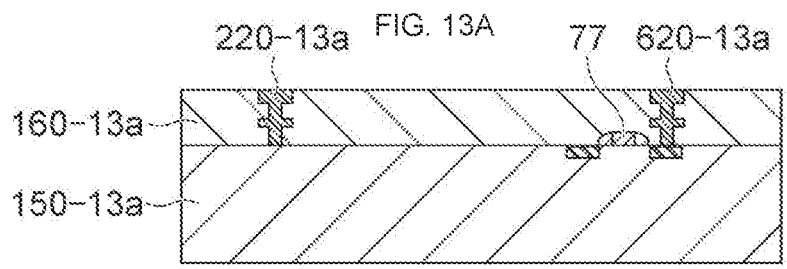
FIGS. 13A, 13B, 13C, and 13D are diagrams for describing a method for manufacturing the semiconductor apparatus to which the present technology is applied.
Figure 13B:
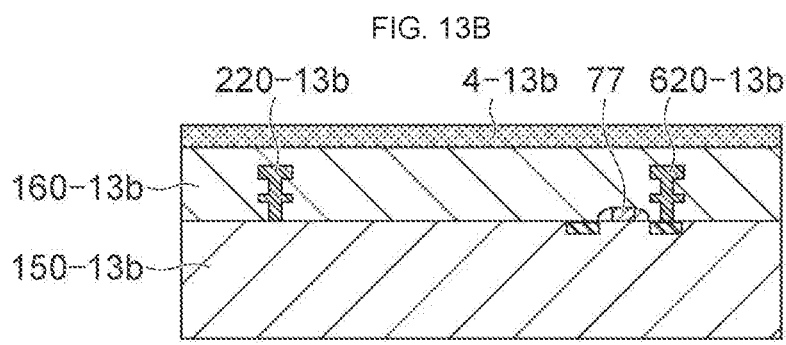

First, the description is made using FIGS. 13A, 13B, 13C, and 13D. In BEOL processes, a guard ring 220-13a and wiring 620-13 are formed in an interlayer insulation film 160-13a on the semiconductor substrate 150-13a, as illustrated in FIG. 13A. As illustrated in FIG. 13B, a thermally conductive material (thermally conductive film) AlN (aluminum nitride) 4-13b is formed on the interlayer insulation film 160-13b in which the formation has been performed.

Figure 13C:
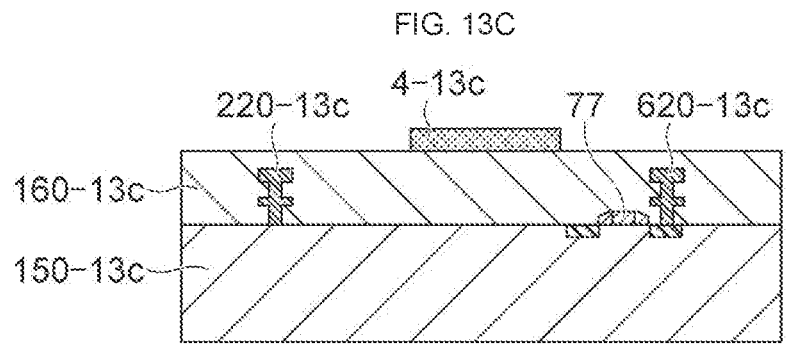
Figure 13D:
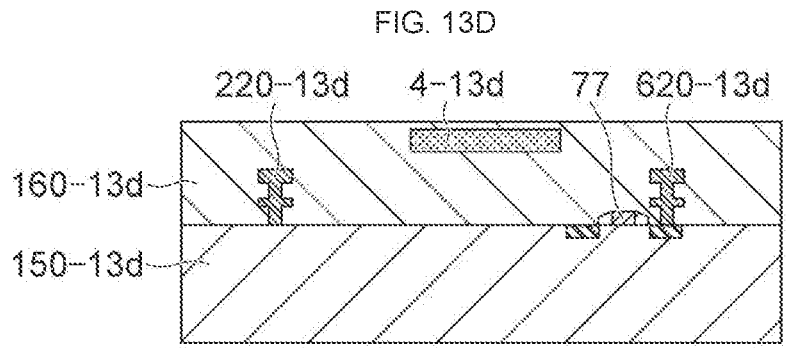

As illustrated in FIG. 13C, the thermally conductive material (thermally conductive film) AlN (aluminum nitride) 4-13c is patterned by lithography and/or dry etching, and, as illustrated in FIG. 13D, formation is performed such that the thermally conductive material (thermally conductive film) AlN (aluminum nitride) 4-13d is embedded in the interlayer insulation film 160-13d.

Figure 14A:
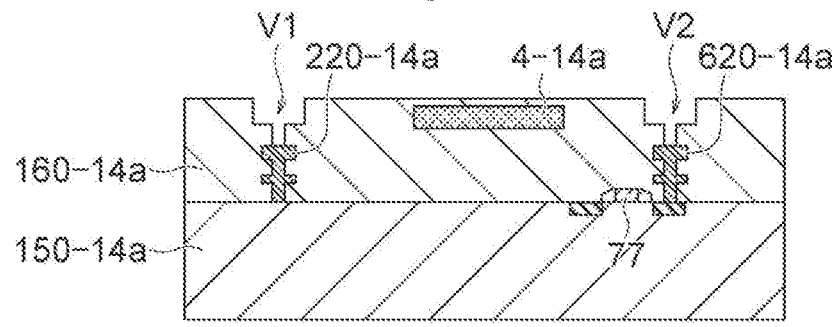
FIGS. 14A, 14B, 14C, and 14D are diagrams for describing the method for manufacturing the semiconductor apparatus to which the present technology is applied.
Figure 14B:
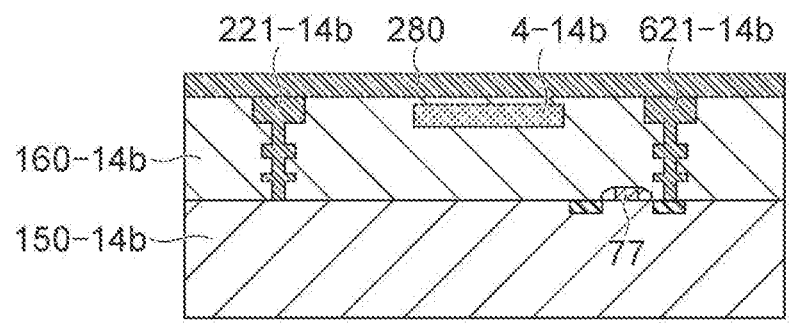
Figure 14C:
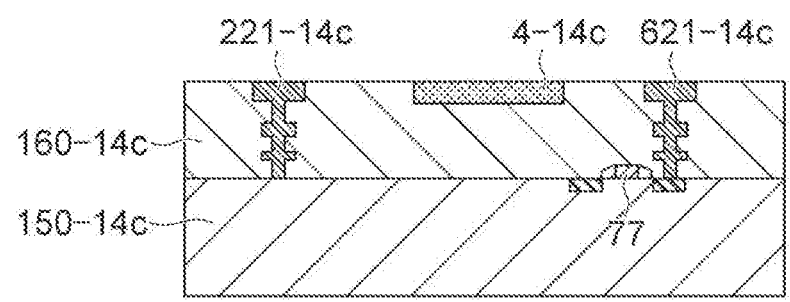

The description is made using FIGS. 14A, 14B, 14C, and 14D. As illustrated in FIG. 14A, a via V1 is formed in a region situated in an upper portion of the guard ring 220-14a, and a via V2 is formed in a region situated in an upper portion of the wiring 620-14a. As illustrated in FIG. 14B, copper (Cu) 280 is embedded, and, as illustrated in FIG. 14C, CMP is performed to form a guard ring 221-14c including a Cu pad, to form wiring 621-14c including a Cu pad, and to expose the thermally conductive material (thermally conductive film) AlN (aluminum nitride) 4-14c.

Figure 14D:
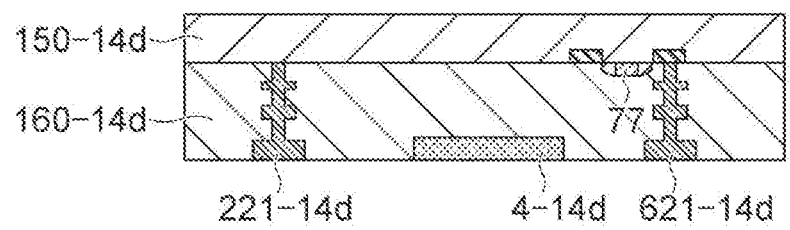

As illustrated in FIG. 14D, the front side and the back side are reversed, and the semiconductor substrate (silicon substrate) 150-14d on the back side (on an upper side in FIG. 14D) is polished.

First, the description is made using FIG. 13. In BEOL processes, a guard ring 220-13a and wiring 620-13 are formed in an interlayer insulation film 160-13a on the semiconductor substrate 150-13a, as illustrated in FIG. 13. As illustrated in FIG. 13, a thermally conductive material (thermally conductive film) AlN (aluminum nitride) 4-13b is formed on the interlayer insulation film 160-13b in which the formation has been performed.

As illustrated in (c) of FIG. 13, the thermally conductive material (thermally conductive film) AlN (aluminum nitride) 4-13c is patterned by lithography and/or dry etching, and, as illustrated in FIG. 13, formation is performed such that the thermally conductive material (thermally conductive film) AlN (aluminum nitride) 4-13d is embedded in the interlayer insulation film 160-13d.

Figure 15:
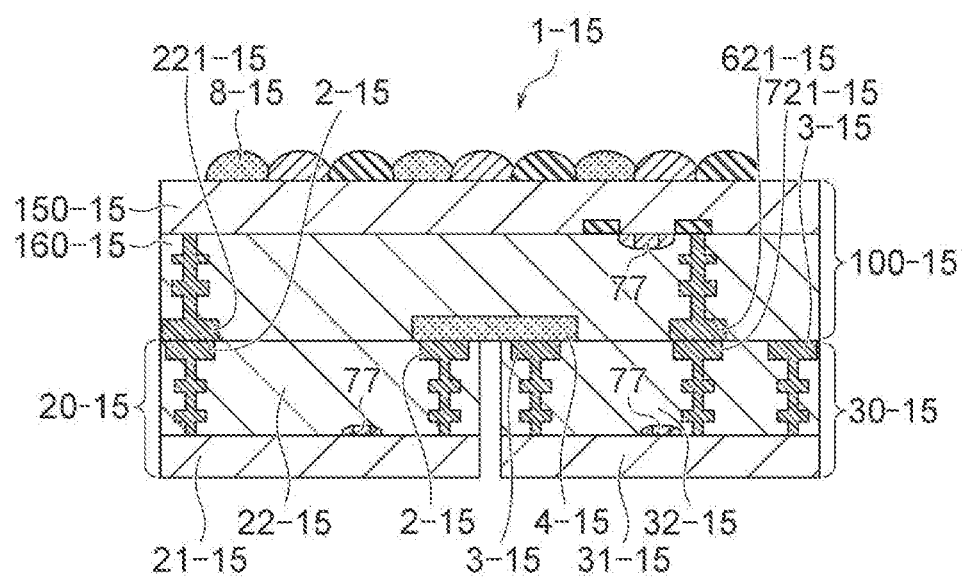
FIG. 15 is a diagram for describing the method for manufacturing the semiconductor apparatus to which the present technology is applied.

Accordingly, the solid-state imaging apparatus 1-15 is obtained, as illustrated in FIG. 15. The solid-state imaging apparatus 1-15 includes a substrate 100-15, and a first chip 20-15 and a second chip 30-15 that are each stacked on the substrate 100-15 (stacked downward in FIG. 15).

The substrate 100-15 includes an imaging device that generates a pixel signal for each pixel. Specifically, the substrate 100-15 includes a solid-state imaging device 150-15 and a wiring layer 160-15, the solid-state imaging device 150-15 including a semiconductor substrate (not illustrated) and a photoelectric converter (not illustrated) that is formed in the semiconductor substrate. Further, a color filter and an on-chip lens 8-15 are formed on the solid-state imaging device 150-15. The first chip 20-15 includes a semiconductor substrate 21-15 and a wiring layer 22-15, and a signal processing circuit such as a logic circuit is formed in the semiconductor substrate 21-15. Further, the second chip 30-15 includes a semiconductor substrate 31-15 and a wiring layer 32-15, and a signal processing circuit such as a memory circuit is formed in the semiconductor substrate 31-15. In FIG. 15, the first chip 20-15 and the second chip 30-15 are formed downward on the substrate 100-15 in substantially the same layer (at the same level), where the thickness of the wiring layer 22-15 (the length of the wiring layer 22-15 in an up-and-down direction in FIG. 15) and the thickness of the wiring layer 32-15 (the length of the wiring layer 32-15 in the up-and-down direction in FIG. 15) are substantially the same as each other, and the thickness of the semiconductor substrate 21-15 (the length of the semiconductor substrate 21-15 in the up-and-down direction in FIG. 15) and the thickness of the semiconductor substrate 31-15 (the length of the semiconductor substrate 31-15 in the up-and-down direction in FIG. 15) are substantially the same as each other.

The substrate 100-15 and the first chip 20-15 are stacked such that the wiring layer 160-15 included in the substrate 100-15 faces the wiring layer 22-15 included in the first chip 20-15, and the substrate 100-15 and the second chip 30-15 are stacked such that the wiring layer 160-15 included in the substrate 100-15 faces the wiring layer 32-15 included in the second chip 30-15. A thermally conductive material 4-15 made of, for example, copper (Cu) is formed in the wiring layer 160-15 included in the substrate 100-15. A first guard ring 2-15 is formed on an outer portion of the wiring layer 22-15 included in the first chip 20-15 (at left and right ends of the wiring layer 22-15 in FIG. 3A), and the first guard ring 2-15 is connected to the semiconductor substrate 21-15. Further, a second guard ring 3-15 is formed on an outer portion of the wiring layer 32-15 included in the second chip 30-15 (at left and right ends of the wiring layer 32-15 in FIG. 15), and the second guard ring 3-15 is connected to the semiconductor substrate 31-15. A portion of the first guard ring 2-15 of the first chip 20-15 that is formed on a side adjacent to the second chip 30-15 (on the right in FIG. 15), and a portion of the second guard ring 3-15 of the second chip 30-15 that is formed on a side adjacent to the first chip 20-15 (on the left in FIG. 15) are connected to each other through the thermally conductive material 4-15. Thus, the semiconductor substrate 21-15, the first guard ring 2-15, the thermally conductive material 4-15, the second guard ring 3-15, and the semiconductor substrate 31-15 are connected to each other. This may result in reducing a difference in temperature between the first chip 20-15 and the second chip 30-15.

The contents described above using FIGS. 13A, 13B, 13C, 13D, 14A, 14B, 14C, 14D, and 15 (the method for manufacturing a semiconductor apparatus) can be applied to a manufacturing method for manufacturing the semiconductor apparatuses of the second to ninth embodiments according to the present technology described later, unless there is a technical inconsistency in particular.

Note that, in addition to the contents described above, contents described with respect to the semiconductor imaging apparatuses of the second to ninth embodiments according to the present technology described later can be applied to the semiconductor apparatus of the first embodiment according to the present technology with no change, unless there is a technical inconsistency in particular.

3. Second Embodiment (Second Example of Semiconductor Apparatus)

Figure 4A:
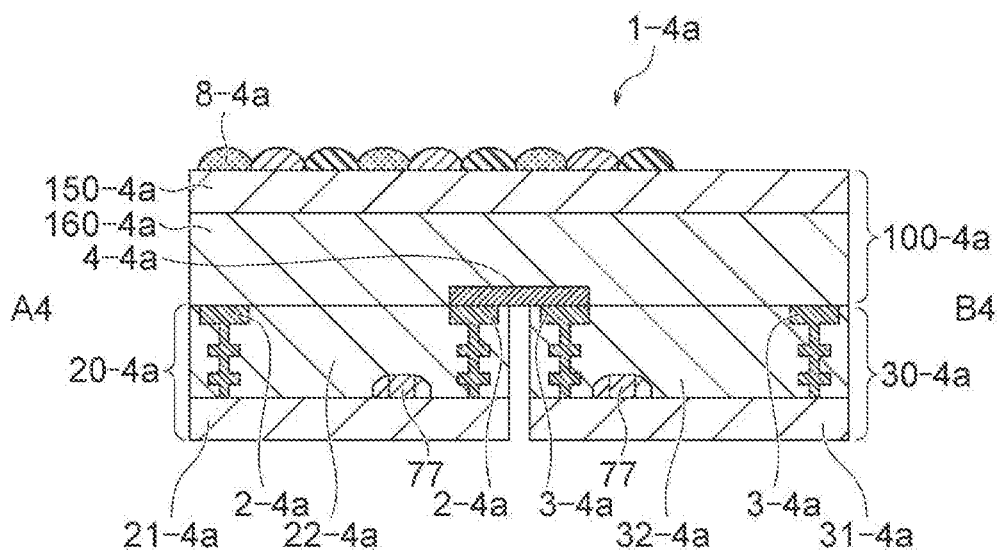
FIGS. 4A and 4B illustrate an example of a configuration of a semiconductor apparatus of a second embodiment to which the present technology is applied.
Figure 4B:
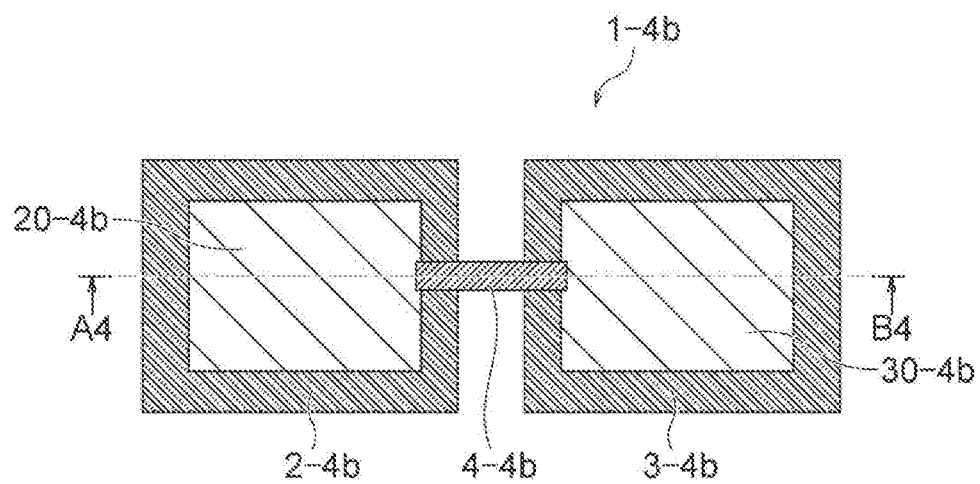

The semiconductor apparatus of the second embodiment according to the present technology (a second example of the semiconductor apparatus) is described using FIGS. 4A and 4B. FIGS. 4A and 4B illustrate an example of a configuration of the semiconductor apparatus of the second embodiment according to the present technology. Specifically, FIG. 4A is a cross-sectional view of a solid-state imaging apparatus 1-4a that is taken along the line A4-B4 illustrated in FIG. 4A, the solid-state imaging apparatus 1-4a being an example of the semiconductor apparatus of the second embodiment according to the present technology, and FIG. 4B is a top view of the solid-state imaging apparatus 1-4b that is the example of the semiconductor apparatus, where a substrate 100-4a illustrated in FIG. 4A is not illustrated (a plan layout diagram of a first chip 20-4b and a second chip 30-4b).

First, the description is made using FIG. 4A. The solid-state imaging apparatus 1-4a includes the substrate 100-4a, and the first chip 20-4a and the second chip 30-4a each being stacked on the substrate 100-4a (stacked downward in FIG. 4A).

The substrate 100-4a includes an imaging device that generates a pixel signal for each pixel. Specifically, the substrate 100-4a includes a solid-state imaging device 150-4a and a wiring layer 160-4a, the solid-state imaging device 150-4a including a semiconductor substrate (not illustrated) and a photoelectric converter (not illustrated) that is formed in the semiconductor substrate. Further, a color filter and an on-chip lens 8-4a are formed on the solid-state imaging device 150-4a. The first chip 20-4a includes a semiconductor substrate 21-4a and a wiring layer 22-4a, and a signal processing circuit such as a logic circuit is formed in the semiconductor substrate 21-4a. Further, the second chip 30-4a includes a semiconductor substrate 31-4a and a wiring layer 32-4a, and a signal processing circuit such as a memory circuit is formed in the semiconductor substrate 31-4a. In FIG. 4A, the first chip 20-4a and the second chip 30-4a are formed downward on the substrate 100-4a in substantially the same layer (at the same level), where the thickness of the wiring layer 22-4a (the length of the wiring layer 22-4a in an up-and-down direction in FIG. 4A) and the thickness of the wiring layer 32-4a (the length of the wiring layer 32-4a in the up-and-down direction in FIG. 4A) are substantially the same as each other, and the thickness of the semiconductor substrate 21-4a (the length of the semiconductor substrate 21-4a in the up-and-down direction in FIG. 4A) and the thickness of the semiconductor substrate 31-3a (the length of the semiconductor substrate 31-3a in the up-and-down direction in FIG. 4A) are substantially the same as each other.

The substrate 100-4a and the first chip 20-4a are stacked such that the wiring layer 160-4a included in the substrate 100-4a faces the wiring layer 22-4a included in the first chip 20-4a, and the substrate 100-4a and the second chip 30-4a are stacked such that the wiring layer 160-4a included in the substrate 100-4a faces the wiring layer 32-4a included in the second chip 30-4a. A thermally conductive material 4-4a made of, for example, copper (Cu) is formed in the wiring layer 160-4a included in the substrate 100-4a. A first guard ring 2-4a is formed on an outer portion of the wiring layer 22-4a included in the first chip 20-4a (at left and right ends of the wiring layer 22-4a in FIG. 4A), and the first guard ring 2-4a is connected to the semiconductor substrate 21-4a. Further, a second guard ring 3-4a is formed on an outer portion of the wiring layer 32-4a included in the second chip 30-4a (at left and right ends of the wiring layer 32-4a in FIG. 4A), and the second guard ring 3-4a is connected to the semiconductor substrate 31-4a. A portion of the first guard ring 2-4a of the first chip 20-4a that is formed on a side adjacent to the second chip 30-4a (on the right in FIG. 4A), and a portion of the second guard ring 3-4a of the second chip 30-4a that is formed on a side adjacent to the first chip 20-4a (on the left in FIG. 4A) are connected to each other through the thermally conductive material 4-4a. Thus, the semiconductor substrate 21-4a, the first guard ring 2-4a, the thermally conductive material 4-4a, the second guard ring 3-4a, and the semiconductor substrate 31-4a are connected to each other. This may result in reducing a difference in temperature between the first chip 20-3a and the second chip 30-3a.

The description is made using FIG. 4B. As illustrated in FIG. 4B, the solid-state imaging apparatus 1-4b includes the first chip 20-4b (on the left in FIG. 4A) and the second chip 30-4b (on the right in FIG. 4B), where the first guard ring 2-4b is formed on an outer peripheral portion of the first chip 20-4b to surround the first chip 20-4b, and the second guard ring 3-4b is formed on an outer peripheral portion of the second chip 30-4b to surround the second chip 30-4b. A right side of the first guard ring 2-4b (on the right in FIG. 4B and on a side adjacent to the second guard ring 3-4b) and a left side of the second guard ring 3-4b (on the left in FIG. 4B and on a side adjacent to the first guard ring 2-4b) are connected to each other through the thermally conductive material 4-4b. In other words, in FIG. 4B, the thermally conductive material 4-4b is joined to (is in contact with) a portion of a region of the right side of the first guard ring 2-4b and a portion of a region of the left side of the second guard ring 3-4b.

Note that, in addition to the contents described above, the contents described with respect to the semiconductor apparatus of the first embodiment according to the present technology described above, and the contents described with respect to the semiconductor apparatuses of the third to ninth embodiments according to the present technology described later can be applied to the semiconductor apparatus of the second embodiment according to the present technology with no change, unless there is a technical inconsistency in particular.

4. Third Embodiment (Third Example of Semiconductor Apparatus)

Figure 5A:
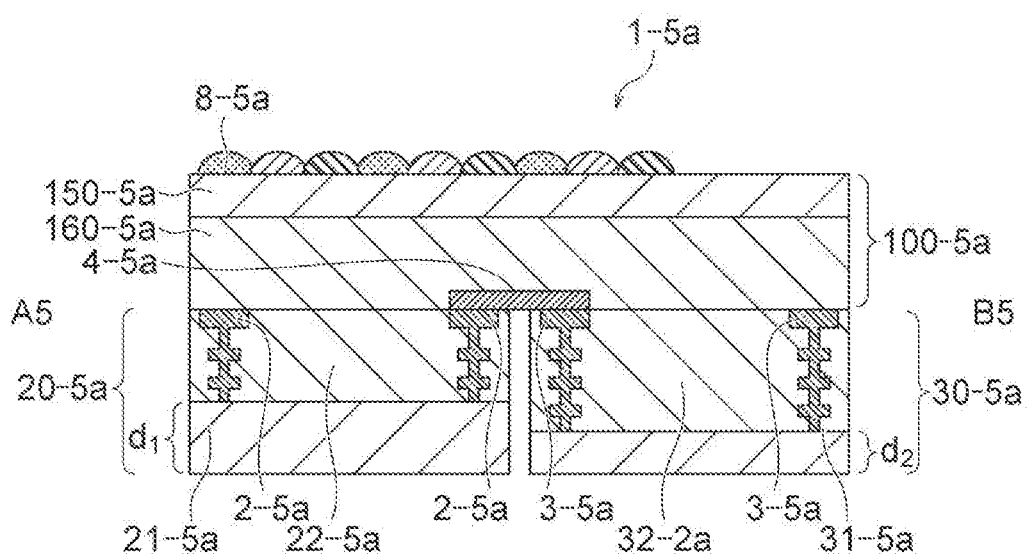
FIGS. 5A and 5B illustrate an example of a configuration of a semiconductor apparatus of a third embodiment to which the present technology is applied.
Figure 5B:
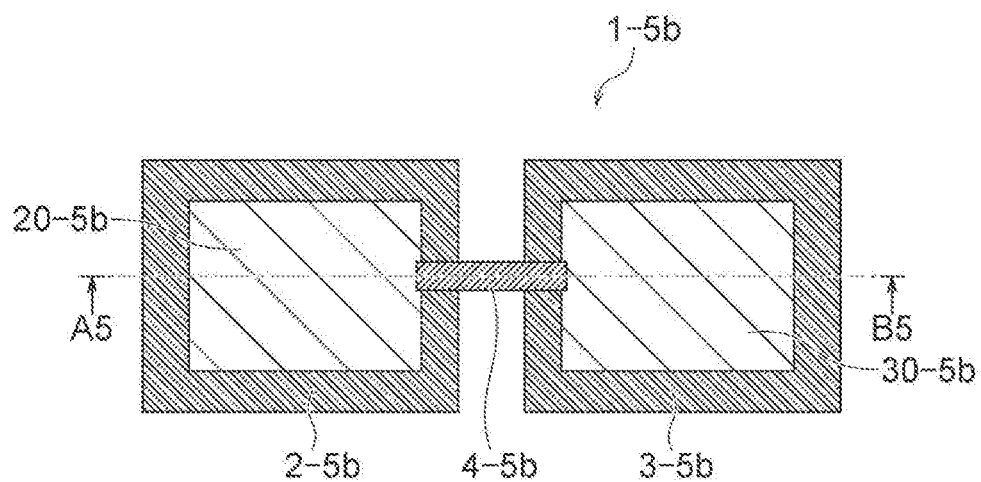

The semiconductor apparatus of the third embodiment according to the present technology (a third example of the semiconductor apparatus) is described using FIGS. 5A and 5B. FIGS. 5A and 5B illustrate an example of a configuration of the semiconductor apparatus of the third embodiment according to the present technology. Specifically, FIG. 5A is a cross-sectional view of a solid-state imaging apparatus 1-5a that is taken along the line A5-B5 illustrated in FIG. 5B, the solid-state imaging apparatus 1-5a being an example of the semiconductor apparatus of the third embodiment according to the present technology, and FIG. 5B is a top view of the solid-state imaging apparatus 1-5b that is the example of the semiconductor apparatus, where a substrate 100-5a illustrated in FIG. 5A is not illustrated (a plan layout diagram of a first chip 20-5b and a second chip 30-5b).

First, the description is made using FIG. 5A. The solid-state imaging apparatus 1-5a includes the substrate 100-5a, and the first chip 20-5a and the second chip 30-5a each being stacked on the substrate 100-5a (stacked downward in FIG. 5A).

The substrate 100-5a includes an imaging device that generates a pixel signal for each pixel. Specifically, the substrate 100-5a includes a solid-state imaging device 150-5a and a wiring layer 160-5a, the solid-state imaging device 150-5a including a semiconductor substrate (not illustrated) and a photoelectric converter (not illustrated) that is formed in the semiconductor substrate. Further, a color filter and an on-chip lens 8-5a are formed on the solid-state imaging device 150-5a. The first chip 20-5a includes a semiconductor substrate 21-5a and a wiring layer 22-5a, and a signal processing circuit such as a logic circuit is formed in the semiconductor substrate 21-5a. Further, the second chip 30-5a includes a semiconductor substrate 31-5a and a wiring layer 32-5a, and a signal processing circuit such as a memory circuit is formed in the semiconductor substrate 31-5a. In FIG. 5A, the first chip 20-3a and the second chip 30-3a are formed downward on the substrate 100-3a in substantially the same layer (at the same level), where the thickness of the wiring layer 22-5a (the length of the wiring layer 22-5a in an up-and-down direction in FIG. 5A) and the thickness of the wiring layer 32-5a (the length of the wiring layer 32-5a in the up-and-down direction in FIG. 5A) are different from each other, and the thickness of the semiconductor substrate 21-5a (the length of the semiconductor substrate 21-5a in the up-and-down direction in FIG. 5A) and the thickness of the semiconductor substrate 31-5a (the length of the semiconductor substrate 31-5a in the up-and-down direction in FIG. 5A) are different from each other. In other words, in FIG. 5A, a thickness d1 of the semiconductor substrate 21-5a is larger than a thickness d2 of the semiconductor substrate 31-5a, and the thickness of the wiring layer 32-5a is larger than the thickness of the wiring layer 22-5a due to a difference in thickness between the semiconductor substrates. When the wiring layer 32-5a and the wiring layer 22-5a are multilayered wiring layers, the number of wiring layers in the wiring layer 32-5a is larger than the number of wiring layers in the wiring layer 22-5a.

The substrate 100-5a and the first chip 20-5a are stacked such that the wiring layer 160-5a included in the substrate 100-5a faces the wiring layer 22-5a included in the first chip 20-5a, and the substrate 100-5a and the second chip 30-5a are stacked such that the wiring layer 160-5a included in the substrate 100-5a faces the wiring layer 32-5a included in the second chip 30-5a. A thermally conductive material 4-5a made of, for example, copper (Cu) is formed in the wiring layer 160-5a included in the substrate 100-5a. A first guard ring 2-5a is formed on an outer portion of the wiring layer 22-5a included in the first chip 20-5a (at left and right ends of the wiring layer 22-5a in FIG. 5A), and the first guard ring 2-5a is connected to the semiconductor substrate 21-5a. Further, a second guard ring 3-5a is formed on an outer portion of the wiring layer 32-5a included in the second chip 30-5a (at left and right ends of the wiring layer 32-5a in FIG. 5A), and the second guard ring 3-5a is connected to the semiconductor substrate 31-5a. A portion of the first guard ring 2-5a of the first chip 20-5a that is formed on a side adjacent to the second chip 30-5a (on the right in FIG. 5A), and a portion of the second guard ring 3-5a of the second chip 30-5a that is formed on a side adjacent to the first chip 20-5a (on the left in FIG. 5A) are connected to each other through the thermally conductive material 4-5a. Thus, the semiconductor substrate 21-5a, the first guard ring 2-5a, the thermally conductive material 4-5a, the second guard ring 3-5a, and the semiconductor substrate 31-5a are connected to each other. This may result in reducing a difference in temperature between the first chip 20-5a and the second chip 30-5a.

The description is made using FIG. 5B. As illustrated in FIG. 5B, the solid-state imaging apparatus 1-5b includes the first chip 20-5b (on the left in FIG. 5B) and the second chip 30-5b (on the right in FIG. 5B), where the first guard ring 2-5b is formed on an outer peripheral portion of the first chip 20-5b to surround the first chip 20-5b, and the second guard ring 3-5b is formed on an outer peripheral portion of the second chip 30-5b to surround the second chip 30-5b. A right side of the first guard ring 2-5b (on the right in FIG. 5B and on a side adjacent to the second guard ring 3-5b) and a left side of the second guard ring 3-5b (on the left in FIG. 5B and on a side adjacent to the first guard ring 2-5b) are connected to each other through the thermally conductive material 4-5b. In other words, in FIG. 5B, the thermally conductive material 4-5b is joined to (is in contact with) a portion of a region of the right side of the first guard ring 2-5b and a portion of a region of the left side of the second guard ring 3-5b.

Note that, in addition to the contents described above, the contents described with respect to the semiconductor apparatuses of the first and second embodiments according to the present technology described above, and the contents described with respect to the semiconductor apparatuses of the fourth to ninth embodiments according to the present technology described later can be applied to the semiconductor apparatus of the third embodiment according to the present technology with no change, unless there is a technical inconsistency in particular.

5. Fourth Embodiment (Fourth Example of Semiconductor Apparatus)

Figure 6A:
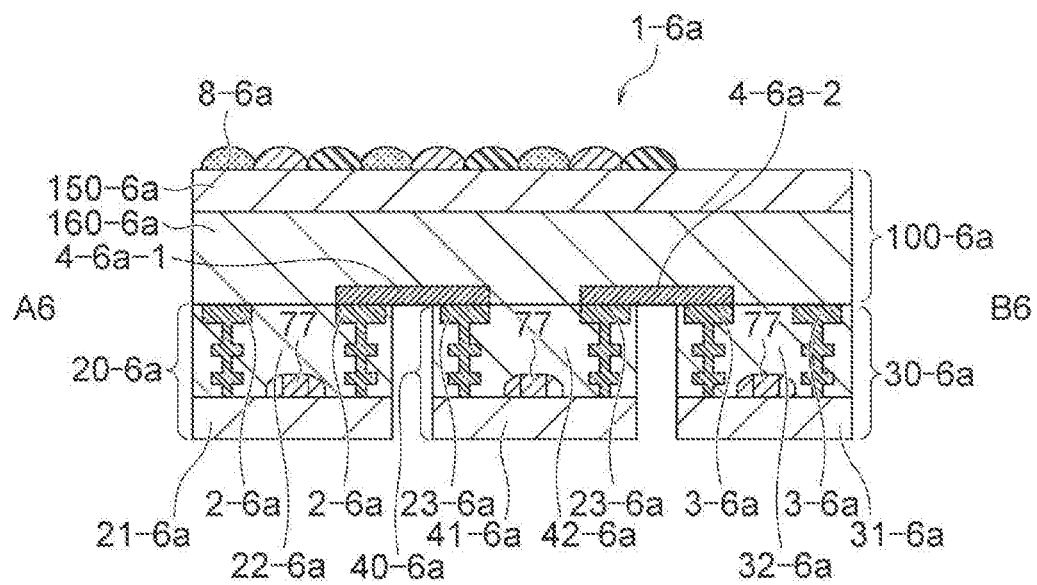
FIGS. 6A and 6B illustrate an example of a configuration of a semiconductor apparatus of a fourth embodiment to which the present technology is applied.
Figure 6B:
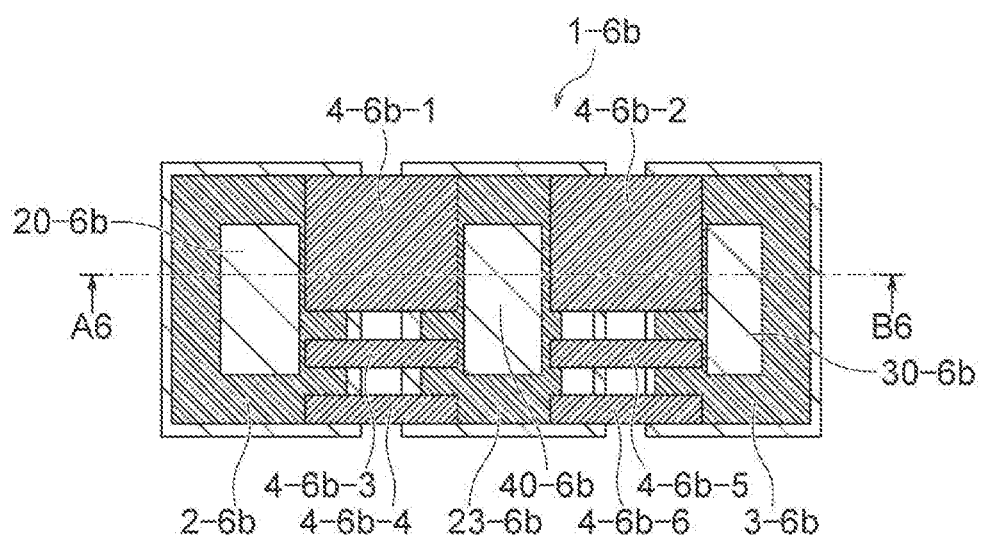

The semiconductor apparatus of the fourth embodiment according to the present technology (a fourth example of the semiconductor apparatus) is described using FIGS. 6A and 6B. FIGS. 6A and 6B illustrate an example of a configuration of the semiconductor apparatus of the fourth embodiment according to the present technology. Specifically, FIG. 6A is a cross-sectional view of a solid-state imaging apparatus 1-6a that is taken along the line A6-B6 illustrated in FIG. 6B, the solid-state imaging apparatus 1-6a being an example of the semiconductor apparatus of the fourth embodiment according to the present technology, and FIG. 6B is a top view of the solid-state imaging apparatus 1-6b that is the example of the semiconductor apparatus, where a substrate 100-6a illustrated in FIG. 6A is not illustrated (a plan layout diagram of a first chip 20-6b, a second chip 30-6b, and a third chip 40-6b).

First, the description is made using FIG. 6A. The solid-state imaging apparatus 1-6a includes the substrate 100-6a; and the first chip 20-6a, the second chip 30-6a, and the third chip 40-6a each being stacked on the substrate 100-6a (stacked downward in FIG. 6A).

The substrate 100-6a includes an imaging device that generates a pixel signal for each pixel. Specifically, the substrate 100-6a includes a solid-state imaging device 150-6a and a wiring layer 160-6a, the solid-state imaging device 150-6a including a semiconductor substrate (not illustrated) and a photoelectric converter (not illustrated) that is formed in the semiconductor substrate. Further, a color filter and an on-chip lens 8-6a are formed on the solid-state imaging device 150-6a. The first chip 20-6a includes a semiconductor substrate 21-6a and a wiring layer 22-6a, and a signal processing circuit such as a logic circuit is formed in the semiconductor substrate 21-6a. Further, the second chip 30-6a includes a semiconductor substrate 31-6a and a wiring layer 32-6a, and a signal processing circuit such as a memory circuit is formed in the semiconductor substrate 31-6a. Furthermore, the third chip 40-6a includes a semiconductor substrate 41-6a and a wiring layer 42-6a, and a signal processing circuit such as a CPU circuit is formed in the semiconductor substrate 41-6a. In FIG. 6A, the first chip 20-6a, the second chip 30-6a, and the third chip 40-6a are formed downward on the substrate 100-6a in substantially the same layer (at the same level), where the thickness of the wiring layer 22-6a (the length of the wiring layer 22-6a in an up-and-down direction in FIG. 6A), the thickness of the wiring layer 32-6a (the length of the wiring layer 32-6a in the up-and-down direction in FIG. 6A), and the thickness of the wiring layer 42-6a (the length of the wiring layer 42-6a in the up-and-down direction in FIG. 6A) are substantially the same as each other, and the thickness of the semiconductor substrate 21-6a (the length of the semiconductor substrate 21-6a in the up-and-down direction in FIG. 6A), the thickness of the semiconductor substrate 31-6a (the length of the semiconductor substrate 31-6a in the up-and-down direction in FIG. 6A), and the thickness of the semiconductor substrate 41-6a (the length of the semiconductor substrate 41-6a in the up-and-down direction in FIG. 6A) are substantially the same as each other.

The substrate 100-6a and the first chip 20-6a are stacked such that the wiring layer 160-6a included in the substrate 100-6a faces the wiring layer 22-6a included in the first chip 20-6a, the substrate 100-6a and the second chip 30-6a are stacked such that the wiring layer 160-6a included in the substrate 100-6a faces the wiring layer 32-6a included in the second chip 30-6a, and the substrate 100-6a and the third chip 40-6a are stacked such that the wiring layer 160-6a included in the substrate 100-6a faces the wiring layer 42-6a included in the third chip 40-6a. A thermally conductive material 4-6a-1 and a thermally conductive material 4-6a-2 that are made of, for example, copper (Cu) are formed in the wiring layer 160-6a included in the substrate 100-6a. A first guard ring 2-6a is formed on an outer portion of the wiring layer 22-6a included in the first chip 20-6a (at left and right ends of the wiring layer 22-6a FIG. 6A), and the first guard ring 2-6a is connected to the semiconductor substrate 21-6a. Further, a second guard ring 3-6a is formed on an outer portion of the wiring layer 32-6a included in the second chip 30-6a (at left and right ends of the wiring layer 32-6a in FIG. 6A), and the second guard ring 3-6a is connected to the semiconductor substrate 31-6a. Furthermore, a third guard ring 23-6a is formed on an outer portion of the wiring layer 42-6a included in the third chip 40-6a (at left and right ends of the wiring layer 42-6a in FIG. 6A), and the third guard ring 23-6a is connected to the semiconductor substrate 41-6a. A portion of the first guard ring 2-6a of the first chip 20-6a that is formed on a side adjacent to the third chip 40-6a (on the right in FIG. 6A), and a portion of the third guard ring 23-6a of the third chip 40-6a that is formed on a side adjacent to the first chip 20-6a (on the left in FIG. 6A) are connected to each other through the thermally conductive material 4-6a-1. Further, a portion of the second guard ring 3-6a of the second chip 30-6a that is formed on a side adjacent to the third chip 40-6a (on the left in FIG. 6A), and a portion of the third guard ring 23-6a of the third chip 40-6a that is formed on a side adjacent to the third chip 30-6a (on the right in FIG. 6A) are connected to each other through the thermally conductive material 4-6a-2. Thus, the semiconductor substrate 21-6a, the first guard ring 2-6a, the thermally conductive material 4-6a-1, the third guard ring 23-6a, and the semiconductor substrate 41-6a are connected to each other. Further, the semiconductor substrate 41-6a, the third guard ring 23-6a, the thermally conductive material 4-6a-2, the second guard ring 3-6a, and the semiconductor substrate 31-6a are connected to each other. This may result in reducing a difference in temperature between the first chip 20-6a, the second chip 30-6a, and the third chip 40-6a.

The description is made using FIG. 6B. As illustrated in FIG. 6B, the solid-state imaging apparatus 1-6b includes the first chip 20-6b (on the left in (b) et FIG. 6B), the second chip 30-6b (on the right in FIG. 6B), and the third chip 40-6b being situated between the first chip 20-6b and the second chip 30-6b, where the first guard ring 2-6b is formed on an outer peripheral portion of the first chip 20-6b to surround the first chip 20-6b, the second guard ring 3-6b is formed on an outer peripheral portion of the second chip 30-6b to surround the second chip 30-6b, and the third guard ring 23-6b is formed on an outer peripheral portion of the third chip 40-6b to surround the third chip 40-6b. A right side of the first guard ring 2-6b (on the right in FIG. 6B and on a side adjacent to the third guard ring 23-6b) and a left side of the third guard ring 23-6b (on the left in FIG. 6B and on a side adjacent to the first guard ring 2-6b) are connected to each other through the thermally conductive material 4-6b-1, a thermally conductive material 4-6b-3, and a thermally conductive material 4-6b-4. In other words, in FIG. 6B, the substantially square thermally conductive material 4-6b-1 is joined to (is in contact with) a portion of a region of the right side of the first guard ring 2-6b and a portion of a region of the left side of the third guard ring 23-6b, the substantially rectangular thermally conductive material 4-6b-3 is joined to (is in contact with) a portion of the region of the right side of the first guard ring 2-6b and a portion of the region of the left side of the third guard ring 23-6b, and the substantially rectangular thermally conductive material 4-6b-4 is joined to (is in contact with) a portion of the region of the right side of the first guard ring 2-6b and a portion of the region of the left side of the third guard ring 23-6b. Further, in FIG. 6B, from among the three areas of the joining (contact) portions described above, the area of the joining (contact) portion in which the thermally conductive material 4-6b-1 is joined to (is in contact with) the right side of the first guard ring 2-6b and the left side of the third guard ring 23-6b is largest, and this provides a highest thermal conductivity. A right side of the third guard ring 23-6b (on the right in FIG. 6B and on a side adjacent to the second guard ring 3-6b) and a left side of the second guard ring 3-6b (on the left in of FIG. 6B and on a side adjacent to the third guard ring 23-6b) are connected to each other through the thermally conductive material 4-6b-2, a thermally conductive material 4-6b-5, and a thermally conductive material 4-6b-6. In other words, in FIG. 6B, the substantially square thermally conductive material 4-6b-2 is joined to (is in contact with) a portion of a region of the right side of the third guard ring 23-6b and a portion of a region of the left side of the second guard ring 2-6b, the substantially rectangular thermally conductive material 4-6b-5 is joined to (is in contact with) a portion of the region of the right side of the third guard ring 23-6b and a portion of the region of the left side of the second guard ring 3-6b, and the substantially rectangular thermally conductive material 4-6b-6 is joined to (is in contact with) a portion of the region of the right side of the third guard ring 23-6b and a portion of the region of the left side of the second guard ring 3-6b. Further, in FIG. 6B, from among the three areas of the joining (contact) portions described above, the area of the joining (contact) portion in which the thermally conductive material 4-6b-2 is joined to (is in contact with) the right side of the third guard ring 23-6b and the left side of the second guard ring 3-6b is largest, and this provides a highest thermal conductivity.

Note that, in addition to the contents described above, the contents described with respect to the semiconductor apparatuses of the first to third embodiments according to the present technology described above, and the contents described with respect to the semiconductor apparatuses of the fifth to ninth embodiments according to the present technology described later can be applied to the semiconductor apparatus of the fourth embodiment according to the present technology with no change, unless there is a technical inconsistency in particular.

6. Fifth Embodiment (Fifth Example of Semiconductor Apparatus)

Figure 7A:
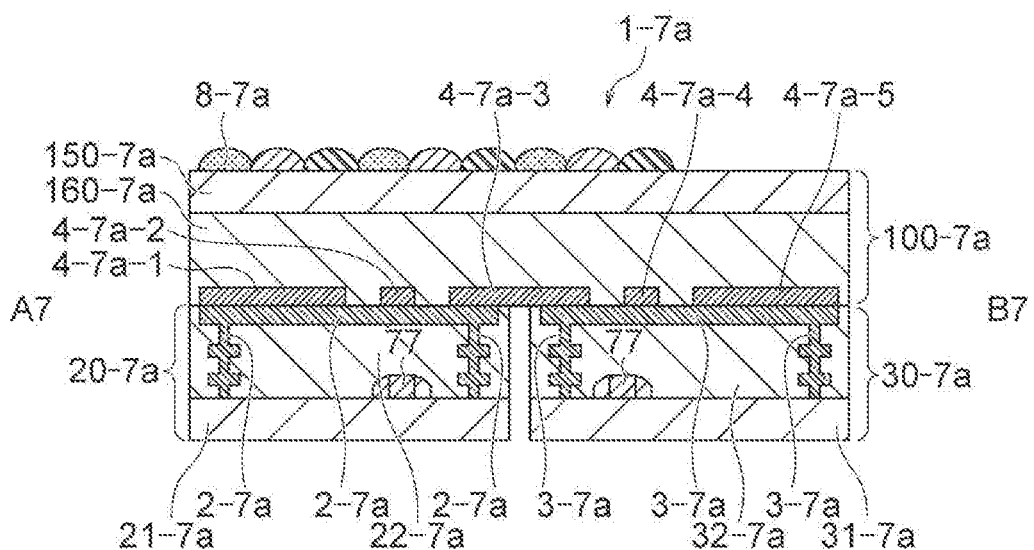
FIGS. 7A and 7B illustrate an example of a configuration of a semiconductor apparatus of a fifth embodiment to which the present technology is applied.
Figure 7B:
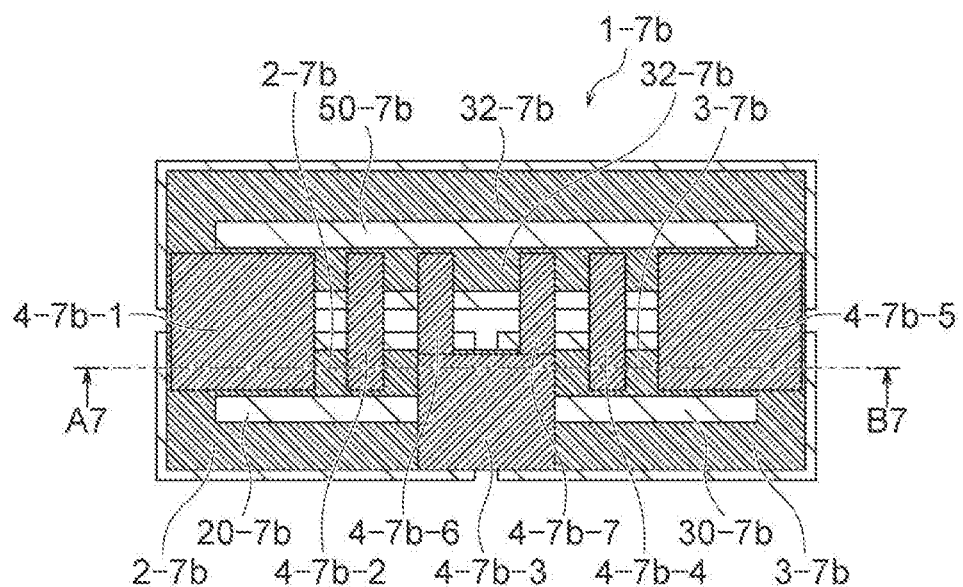

The semiconductor apparatus of the fifth embodiment according to the present technology (a fifth example of the semiconductor apparatus) is described using FIGS. 7A and 7B. FIGS. 7A and 7B illustrate an example of a configuration of the semiconductor apparatus of the fifth embodiment according to the present technology. Specifically, FIG. 7A is a cross-sectional view of a solid-state imaging apparatus 1-7a that is taken along the line A7-B7 illustrated in FIG. 7B, the solid-state imaging apparatus 1-7a being an example of the semiconductor apparatus of the fifth embodiment according to the present technology, and FIG. 7B is a top view of the solid-state imaging apparatus 1-7b that is the example of the semiconductor apparatus, where a substrate 100-7a illustrated in FIG. 7A is not illustrated (a plan layout diagram of a first chip 20-7b, a second chip 30-7b, and a third chip 50-7b).

First, the description is made using FIG. 7A. The solid-state imaging apparatus 1-7a includes the substrate 100-7a; and the first chip 20-7a, the second chip 30-7a, and the third chip (not illustrated in FIG. 7A) each being stacked on the substrate 100-7a (stacked downward in FIG. 7A).

The substrate 100-7a includes an imaging device that generates a pixel signal for each pixel. Specifically, the substrate 100-7a includes a solid-state imaging device 150-7a and a wiring layer 160-7a, the solid-state imaging device 150-7a including a semiconductor substrate (not illustrated) and a photoelectric converter (not illustrated) that is formed in the semiconductor substrate. Further, a color filter and an on-chip lens 8-7a are formed on the solid-state imaging device 150-7a. The first chip 20-7a includes a semiconductor substrate 21-7a and a wiring layer 22-7a, and a signal processing circuit such as a logic circuit is formed in the semiconductor substrate 21-7a. Further, the second chip 30-7a includes a semiconductor substrate 31-7a and a wiring layer 32-7a, and a signal processing circuit such as a memory circuit is formed in the semiconductor substrate 31-7a. Furthermore, the third chip being situated behind the first chip 20-7a and the second chip 30-70a (on the rear side as viewed from the surface of the sheet of the figure) and stacked on the substrate 100-7a includes a semiconductor substrate and a wiring layer, and a signal processing circuit such as a CPU circuit is formed in the semiconductor substrate of the third chip. This is not illustrated in FIG. 7A. In FIG. 7A, the first chip 20-7a, the second chip 30-7a, and the third chip are formed downward on the substrate 100-7a in substantially the same layer (at the same level), where the thickness of the wiring layer 22-7a (the length of the wiring layer 22-7a in an up-and-down direction in FIG. 7A), the thickness of the wiring layer 32-7a (the length of the wiring layer 32-7a in the up-and-down direction in FIG. 7A), and the thickness of the wiring layer of the third chip (the length of the wiring layer of the third chip in the up-and-down direction in FIG. 7A) are substantially the same as each other, and the thickness of the semiconductor substrate 21-7a (the length of the semiconductor substrate 21-7a in the up-and-down direction in FIG. 7A), the thickness of the semiconductor substrate 31-7a (the length of the semiconductor substrate 31-7a in the up-and-down direction in FIG. 7A), and the thickness of the semiconductor substrate of the third chip (the length of the semiconductor substrate of the third chip in the up-and-down direction in FIG. 7A) are substantially the same as each other.

The substrate 100-7a and the first chip 20-7a are stacked such that the wiring layer 160-7a included in the substrate 100-7a faces the wiring layer 22-7a included in the first chip 20-7a, the substrate 100-7a and the second chip 30-7a are stacked such that the wiring layer 160-7a included in the substrate 100-7a faces the wiring layer 32-7a included in the second chip 30-7a, and the substrate 100-7a and the third chip (not illustrated) are stacked such that the wiring layer 160-7a included in the substrate 100-7a faces the wiring layer included in the third chip. Thermally conductive materials 4-7a-1 to 4-7a-5 made of, for example, copper (Cu) are formed in the wiring layer 160-7a included in the substrate 100-7a. A first guard ring 2-7a is formed on an outer portion of the wiring layer 22-7a included in the first chip 20-7a (at left and right ends of the wiring layer 22-7a in FIG. 7A), and is formed on a stacking (joining) interface between the wiring layer 22-7a included in the first chip 20-7a and the substrate 100-7a. The first guard ring 2-7a is connected to the semiconductor substrate 21-7a. Further, a second guard ring 3-7a is formed on an outer portion of the wiring layer 32-7a included in the second chip 30-7a (at left and right ends of the wiring layer 32-7a in FIG. 7A), and is formed on a stacking (joining) interface between the wiring layer 32-7a included in the second chip 30-7a and the substrate 100-7a. The second guard ring 3-7a is connected to the semiconductor substrate 31-7a. A portion of the first guard ring 2-7a of the first chip 20-7a that is formed on a side adjacent to the second chip 30-7a (on the right in FIG. 7A), and a portion of the second guard ring 3-7a of the second chip 30-7a that is formed on a side adjacent to the first chip 20-7a (on the left in FIG. 7A) are connected to each other through the thermally conductive material 4-7a-3. Further, a portion of the guard ring 2-7a and a portion of the guard ring of the third chip are connected to each other through the thermally conductive materials 4-7a-1 and 4-7a-2, and a portion of the guard ring 3-7a and a portion of the guard ring of the third chip are connected to each other through the thermally conductive materials 4-7a-4 and 4-7a-5. This is not illustrated in the figure. Thus, the semiconductor substrate 21-7a, the first guard ring 2-7a, the thermally conductive materials 4-7a-1 to 4-7a-5, the second guard ring 3-7a, the semiconductor substrate 31-7a, the semiconductor substrate of the third chip, and the guard ring of the third chip are connected to each other. This may result in reducing a difference in temperature between the first chip 20-7a, the second chip 30-7a, and the third chip.

The description is made using FIG. 7B. As illustrated in FIG. 7B, the solid-state imaging apparatus 1-7b includes the first chip 20-7b (on the left in FIG. 7B), the second chip 30-7b (on the right in FIG. 7B), and the third chip 50-7b being situated above the first chip 20-7b and the second chip 30-7b (in an upper portion in FIG. 3B), where the first guard ring 2-7b is formed on an outer peripheral portion of the first chip 20-7b to surround the first chip 20-7b, the second guard ring 3-7b is formed on an outer peripheral portion of the second chip 30-7b to surround the second chip 30-7b, and the third guard ring 32-7b is formed on an outer peripheral portion of the third chip 50-7b to surround the third chip 50-7b.

A right side of the first guard ring 2-7b (on the right in FIG. 7B and on a side adjacent to the second guard ring 3-7b) and a left side of the second guard ring 3-7b (on the left in FIG. 7B and on a side adjacent to the first guard ring 2-7b) are connected to each other through the thermally conductive material 4-7b-3. In other words, in FIG. 7B, the substantially square thermally conductive material 4-7b-3 is joined to (is in contact with) a portion of a region of the right side of the first guard ring 2-7b and a portion of a region of the left side of the second guard ring 3-7b. An upper side of the first guard ring 2-7b (in an upper portion in FIG. 7B and on a side adjacent to the third guard ring 32-7b) and a lower side of the third guard ring 32-7b (in a lower portion in FIG. 7B and on a side adjacent to the first guard ring 2-7b) are connected to each other through the thermally conductive materials 4-7b-1, 4-7b-2, and 4-7b-6. In other words, in FIG. 7B, the substantially square thermally conductive material 4-7b-1 is joined to (is in contact with) a portion of a region of the upper side of the first guard ring 2-7b and a portion of a region of the lower side of the third guard ring 32-7b, the substantially rectangular thermally conductive material 4-7b-2 is joined to (is in contact with) a portion of the region of the upper side of the first guard ring 2-7b and a portion of the region of the lower side of the third guard ring 32-7b, and the substantially rectangular thermally conductive material 4-7b-6 is joined to (is in contact with) a portion of the region of the upper side of the first guard ring 2-7b and a portion of the region of the lower side of the third guard ring 32-7b. Further, in of FIG. 7B, from among the three areas of the joining (contact) portions described above, the area of the joining (contact) portion in which the thermally conductive material 4-7b-1 is joined to (is in contact with) the upper side of the first guard ring 2-7b and the lower side of the third guard ring 32-7b is largest, and this provides a highest thermal conductivity.

An upper side of the second guard ring 3-7b (in the upper portion in FIG. 7B and on a side adjacent to the third guard ring 32-7b) and the lower side of the third guard ring 32-7b (in the lower portion in FIG. 7B and on a side adjacent to the second guard ring 2-7b) are connected to each other through the thermally conductive materials 4-7b-5, 4-7b-4, and 4-7b-7. In other words, in FIG. 7B, the substantially square thermally conductive material 4-7b-5 is joined to (is in contact with) a portion of a region of the upper side of the second guard ring 3-7b and a portion of the region of the lower side of the third guard ring 32-7b, the substantially rectangular thermally conductive material 4-7b-4 is joined to (is in contact with) a portion of the region of the upper side of the second guard ring 3-7b and a portion of the region of the lower side of the third guard ring 32-7b, and the substantially rectangular thermally conductive material 4-7b-7 is joined to (is in contact with) a portion of the region of the upper side of the second guard ring 3-7b and a portion of the region of the lower side of the third guard ring 32-7b. Further, in FIG. 7B, from among the three areas of the joining (contact) portions described above, the area of the joining (contact) portion in which the thermally conductive material 4-7b-5 is joined to (is in contact with) the upper side of the second guard ring 3-7b and the lower side of the third guard ring 32-7b is largest, and this provides a highest thermal conductivity.

Note that, in addition to the contents described above, the contents described with respect to the semiconductor apparatuses of the first to fourth embodiments according to the present technology described above, and the contents described with respect to the semiconductor apparatuses of the sixth to ninth embodiments according to the present technology described later can be applied to the semiconductor apparatus of the fifth embodiment according to the present technology with no change, unless there is a technical inconsistency in particular.

7. Sixth Embodiment (Sixth Example of Semiconductor Apparatus)

Figure 8A:
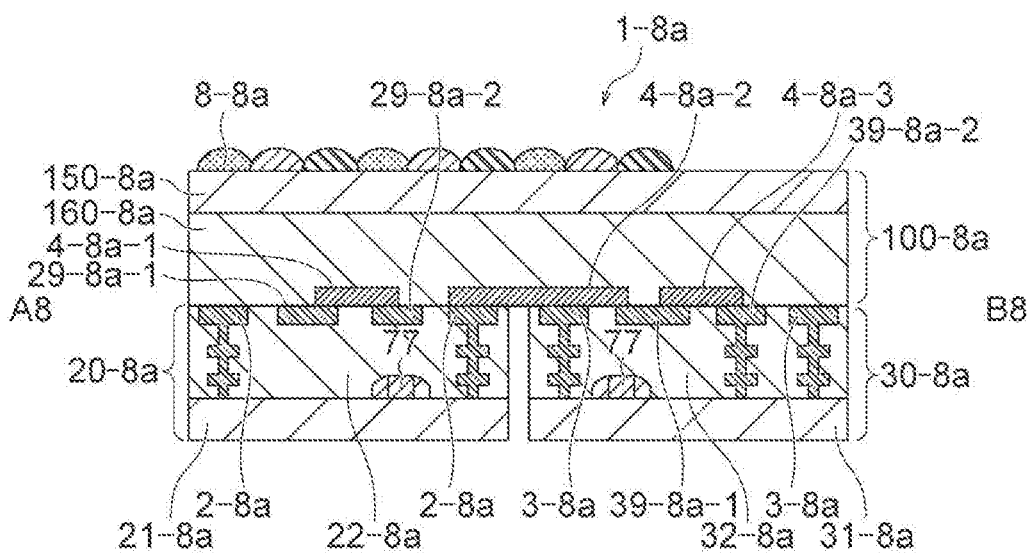
FIGS. 8A and 8B illustrate an example of a configuration of a semiconductor apparatus of a sixth embodiment to which the present technology is applied.
Figure 8B:
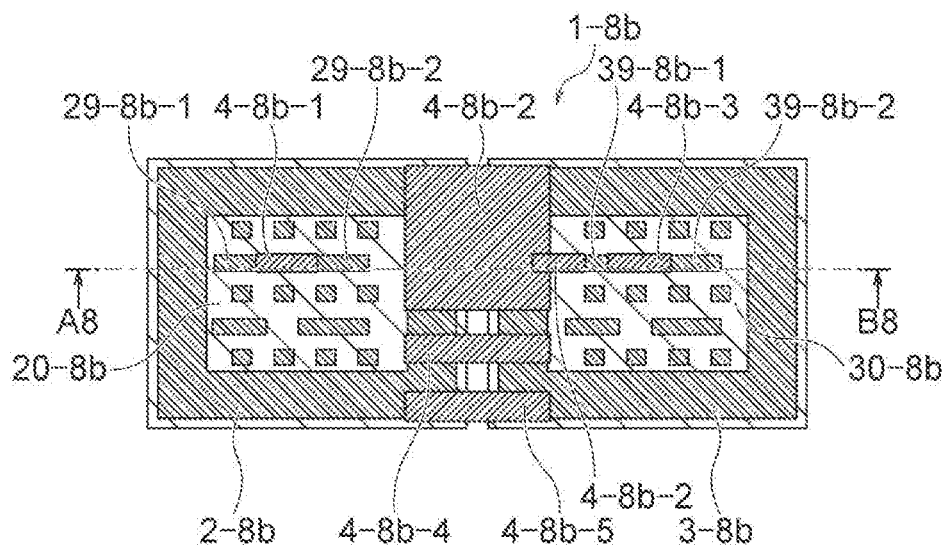

The semiconductor apparatus of the sixth embodiment according to the present technology (a sixth example of the semiconductor apparatus) is described using FIGS. 8A and 8B. FIGS. 8A and 8B illustrate an example of a configuration of the semiconductor apparatus of the sixth embodiment according to the present technology. Specifically, FIG. 8A is a cross-sectional view of a solid-state imaging apparatus 1-8a that is taken along the line A8-B8 illustrated in FIG. 8B, the solid-state imaging apparatus 1-8a being an example of the semiconductor apparatus of the sixth embodiment according to the present technology, and FIG. 8B is a top view of the solid-state imaging apparatus 1-8b that is the example of the semiconductor apparatus, where a substrate 100-8a illustrated in FIG. 8A is not illustrated (a plan layout diagram of a first chip 20-8b and a second chip 30-8b).

First, the description is made using FIG. 8A. The solid-state imaging apparatus 1-8a includes the substrate 100-8a, and the first chip 20-8a and the second chip 30-8a each being stacked on the substrate 100-8a (stacked downward in FIG. 8A).

The substrate 100-8a includes an imaging device that generates a pixel signal for each pixel. Specifically, the substrate 100-8a includes a solid-state imaging device 150-8a and a wiring layer 160-8a, the solid-state imaging device 150-8a including a semiconductor substrate (not illustrated) and a photoelectric converter (not illustrated) that is formed in the semiconductor substrate. Further, a color filter and an on-chip lens 8-8a are formed on the solid-state imaging device 150-8a. The first chip 20-8a includes a semiconductor substrate 21-8a and a wiring layer 22-8a, and a signal processing circuit such as a logic circuit is formed in the semiconductor substrate 21-8a. Further, the second chip 30-8a includes a semiconductor substrate 31-8a and a wiring layer 32-8a, and a signal processing circuit such as a memory circuit is formed in the semiconductor substrate 31-8a. In FIG. 8A, the first chip 20-8a and the second chip 30-8a are formed downward on the substrate 100-8a in substantially the same layer (at the same level), where the thickness of the wiring layer 22-8a (the length of the wiring layer 22-8a in an up-and-down direction in FIG. 3A) and the thickness of the wiring layer 32-8a (the length of the wiring layer 32-8a in the up-and-down direction in FIG. 3A) are substantially the same as each other, and the thickness of the semiconductor substrate 21-8a (the length of the semiconductor substrate 21-8a in the up-and-down direction in FIG. 3A) and the thickness of the semiconductor substrate 31-8a (the length of the semiconductor substrate 31-8a in the up-and-down direction in FIG. 3A) are substantially the same as each other.

The substrate 100-8a and the first chip 20-8a are stacked such that the wiring layer 160-8a included in the substrate 100-8a faces the wiring layer 22-8a included in the first chip 20-8a, and the substrate 100-8a and the second chip 30-8a are stacked such that the wiring layer 160-8a included in the substrate 100-8a faces the wiring layer 32-8a included in the second chip 30-8a. Thermally conductive materials 4-8a to 4-8a-3 made of, for example, copper (Cu) are formed in the wiring layer 160-8a included in the substrate 100-8a. A first guard ring 2-8a is formed on an outer portion of the wiring layer 22-8a included in the first chip 20-8a (at left and right ends of the wiring layer 22-8a in FIG. 8A), and the first guard ring 2-8a is connected to the semiconductor substrate 21-8a. Further, a second guard ring 3-8a is formed on an outer portion of the wiring layer 32-8a included in the second chip 30-8a (at left and right ends of the wiring layer 32-8a in FIG. 8A), and the second guard ring 3-8a is connected to the semiconductor substrate 31-8a. A portion of the first guard ring 2-8a of the first chip 20-8a that is formed on a side adjacent to the second chip 30-8a (on the right in FIG. 8A), and a portion of the second guard ring 3-8a of the second chip 30-8a that is formed on a side adjacent to the first chip 20-8a (on the left in FIG. 8A) are connected to each other through the thermally conductive material 4-8a-2. Thus, the semiconductor substrate 21-8a, the first guard ring 2-8a, the thermally conductive material 4-8a, the second guard ring 3-8a, and the semiconductor substrate 31-8a are connected to each other. This may result in reducing a difference in temperature between the first chip 20-8a and the second chip 30-8a. Further, the thermally conductive material 4-8a-1 is connected to dummy wiring 29-8a-1 and dummy wiring 29-8a-2 that are formed in the first chip 20-8a, and the thermally conductive material 4-8a-3 is connected to dummy wiring 39-8a-1 and dummy wiring 39-8a-2 that are formed in the first chip 30-8a. This results in further reducing a difference in temperature between the chips.

The description is made using FIG. 8B. As illustrated in FIG. 8B, the solid-state imaging apparatus 1-8b includes the first chip 20-8b (on the left in FIG. 8B) and the second chip 30-8b (on the right in FIG. 8B), where the first guard ring 2-8b is formed on an outer peripheral portion of the first chip 20-8b to surround the first chip 20-8b, and the second guard ring 3-8b is formed on an outer peripheral portion of the second chip 30-8b to surround the second chip 30-8b. Further, the dummy wiring 29-8b-1 and the dummy wiring 29-8b-2 are formed in the first chip 20-8b, and the dummy wiring 39-8b-1 and the dummy wiring 39-8b-2 are formed in the second chip 30-8b. A right side of the first guard ring 2-8b (on the right in FIG. 8B and on a side adjacent to the second guard ring 3-8b) and a left side of the second guard ring 3-8b (on the left in FIG. 8B and on a side adjacent to the first guard ring 2-8b) are connected to each other through the thermally conductive materials 4-8b-2, 4-8b-4, and 4-8b-5. In other words, in FIG. 8B, the substantially square thermally conductive material 4-8b-2 is joined to (is in contact with) a portion of a region of the right side of the first guard ring 2-8b and a portion of a region of the left side of the second guard ring 3-8b, the substantially rectangular thermally conductive material 4-8b-4 is joined to (is in contact with) a portion of the region of the right side of the first guard ring 2-8b and a portion of the region of the left side of the second guard ring 3-8b, and the substantially rectangular thermally conductive material 4-8b-5 is joined to (is in contact with) a portion of the region of the right side of the first guard ring 2-6b and a portion of the region of the left side of the second guard ring 3-8b. Further, in FIG. 8B, from among the three areas of the joining (contact) portions described above, the area of the joining (contact) portion in which the thermally conductive material 4-8b-2 is joined to (is in contact with) the right side of the first guard ring 2-8b and the left side of the second guard ring 3-8b is largest, and this provides a highest thermal conductivity.

The dummy wiring 29-8b-1, the thermally conductive material 4-8b-1, and the dummy wiring 29-8b-2 are connected to each other in this order. Further, the dummy wiring 39-8b-2, the thermally conductive material 4-8b-3, the dummy wiring 39-8b-1, and the thermally conductive material 4-8b-2 are connected in this order, and heat is conducted from the second chip 30-8b to the first chip 20-8b.

Note that, in addition to the contents described above, the contents described with respect to the semiconductor apparatuses of the first to fifth embodiments according to the present technology described above, and the contents described with respect to the semiconductor apparatuses of the seventh to ninth embodiments according to the present technology described later can be applied to the semiconductor apparatus of the sixth embodiment according to the present technology with no change, unless there is a technical inconsistency in particular.

8. Seventh Embodiment (Seventh Example of Semiconductor Apparatus)

Figure 9:
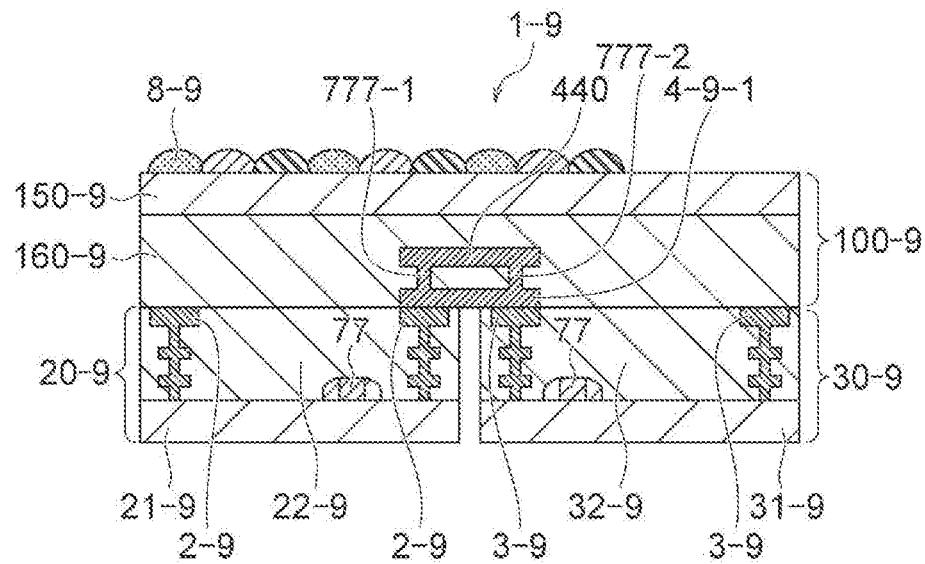
FIG. 9 illustrates an example of a configuration of a semiconductor apparatus of a seventh embodiment to which the present technology is applied.

The semiconductor apparatus of the seventh embodiment according to the present technology (a seventh example of the semiconductor apparatus) is described using FIG. 9. FIG. 9 illustrates an example of a configuration of the semiconductor apparatus of the seventh embodiment according to the present technology. Specifically, FIG. 9 is a cross-sectional view of a solid-state imaging apparatus 1-9 that is an example of the semiconductor apparatus of the seventh embodiment according to the present technology.

First, the description is made using FIG. 9. The solid-state imaging apparatus 1-9 includes a substrate 100-9, and a first chip 20-9 and a second chip 30-9 that are each stacked on the substrate 100-9 (stacked downward in FIG. 9).

The substrate 100-9a includes an imaging device that generates a pixel signal for each pixel. Specifically, the substrate 100-9a includes a solid-state imaging device 150-9 and a wiring layer 160-9, the solid-state imaging device 150-9 including a semiconductor substrate (not illustrated) and a photoelectric converter (not illustrated) that is formed in the semiconductor substrate. Further, a color filter and an on-chip lens 8-9 are formed on the solid-state imaging device 150-9. The first chip 20-9 includes a semiconductor substrate 21-9 and a wiring layer 22-9, and a signal processing circuit such as a logic circuit is formed in the semiconductor substrate 21-9. Further, the second chip 30-9 includes a semiconductor substrate 31-9 and a wiring layer 32-9, and a signal processing circuit such as a memory circuit is formed in the semiconductor substrate 31-9. In FIG. 9, the first chip 20-9 and the second chip 30-9 are formed downward on the substrate 100-9 in substantially the same layer (at the same level), where the thickness of the wiring layer 22-9 (the length of the wiring layer 22-9 in an up-and-down direction in FIG. 9) and the thickness of the wiring layer 32-9 (the length of the wiring layer 32-9 in the up-and-down direction in FIG. 9) are substantially the same as each other, and the thickness of the semiconductor substrate 21-9 (the length of the semiconductor substrate 21-9 in the up-and-down direction in FIG. 9) and the thickness of the semiconductor substrate 31-9 (the length of the semiconductor substrate 31-9 in the up-and-down direction in FIG. 9) are substantially the same as each other.

The substrate 100-9 and the first chip 20-9 are stacked such that the wiring layer 160-9 included in the substrate 100-9 faces the wiring layer 22-9 included in the first chip 20-9, and the substrate 100-9 and the second chip 30-9 are stacked such that the wiring layer 160-9 included in the substrate 100-9 faces the wiring layer 32-9 included in the second chip 30-9. A thermally conductive material 4-9-1 made of, for example, copper (Cu) is formed in the wiring layer 160-9 included in the substrate 100-9. A first guard ring 2-9 is formed on an outer portion of the wiring layer 22-9 included in the first chip 20-9 (at left and right ends of the wiring layer 22-9 in FIG. 9), and the first guard ring 2-9 is connected to the semiconductor substrate 21-9. Further, a second guard ring 3-9 is formed on an outer portion of the wiring layer 32-9 included in the second chip 30-9 (at left and right ends of the wiring layer 32-9 in FIG. 9), and the second guard ring 3-9 is connected to the semiconductor substrate 31-9. A portion of the first guard ring 2-9 of the first chip 20-9 that is formed on a side adjacent to the second chip 30-9 (on the right in FIG. 9), and a portion of the second guard ring 3-9 of the second chip 30-9 that is formed on a side adjacent to the first chip 20-9 (on the left in FIG. 8A) are connected to each other through the thermally conductive material 4-9-1. Thus, the semiconductor substrate 21-9, the first guard ring 2-9, the thermally conductive material 4-9-1, the second guard ring 3-9, and the semiconductor substrate 31-9 are connected to each other. This may result in reducing a difference in temperature between the first chip 20-9 and the second chip 30-9. Further, through vias 777-1 and 777-2, the thermally conductive material 4-9-1 is connected to metal wiring 440 formed in the substrate 100-9 (the wiring layer 160-9). This results in further reducing a difference in temperature between the chips.

Note that, in addition to the contents described above, the contents described with respect to the semiconductor apparatuses of the first to sixth embodiments according to the present technology described above, and the contents described with respect to the semiconductor apparatuses of the eighth and ninth embodiments according to the present technology described later can be applied to the semiconductor apparatus of the seventh embodiment according to the present technology with no change, unless there is a technical inconsistency in particular.

9. Eighth Embodiment (Eighth Example of Semiconductor Apparatus)

Figure 10:
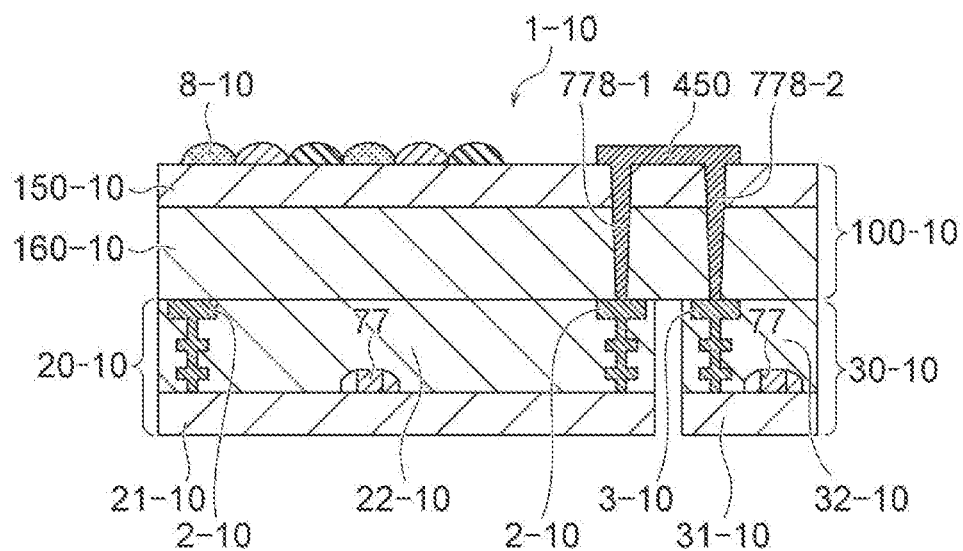
FIG. 10 illustrates an example of a configuration of a semiconductor apparatus of an eighth embodiment to which the present technology is applied.

The semiconductor apparatus of the eighth embodiment according to the present technology (an eighth example of the semiconductor apparatus) is described using FIG. 10. FIG. 10 illustrates an example of a configuration of the semiconductor apparatus of the eighth embodiment according to the present technology. Specifically, FIG. 10 is a cross-sectional view of a solid-state imaging apparatus 1-10 that is an example of the semiconductor apparatus of the eighth embodiment according to the present technology.

First, the description is made using FIG. 10. The solid-state imaging apparatus 1-10 includes a substrate 100-10, and a first chip 20-10 and a second chip 30-10 that are each stacked on the substrate 100-10 (stacked downward in FIG. 10).

The substrate 100-10 includes an imaging device that generates a pixel signal for each pixel. Specifically, the substrate 100-10 includes a solid-state imaging device 150-10 and a wiring layer 160-10, the solid-state imaging device 150-10 including a semiconductor substrate (not illustrated) and a photoelectric converter (not illustrated) that is formed in the semiconductor substrate. Further, a color filter and an on-chip lens 8-10 are formed on the solid-state imaging device 150-10. The first chip 20-10 includes a semiconductor substrate 21-10 and a wiring layer 22-10, and a signal processing circuit such as a logic circuit is formed in the semiconductor substrate 21-10. Further, the second chip 30-10 includes a semiconductor substrate 31-10 and a wiring layer 32-10, and a signal processing circuit such as a memory circuit is formed in the semiconductor substrate 31-10. In FIG. 10, the first chip 20-10 and the second chip 30-10 are formed downward on the substrate 100-10 in substantially the same layer (at the same level), where the thickness of the wiring layer 22-10 (the length of the wiring layer 22-10 in an up-and-down direction in FIG. 10) and the thickness of the wiring layer 32-10 (the length of the wiring layer 32-10 in the up-and-down direction in FIG. 10) are substantially the same as each other, and the thickness of the semiconductor substrate 21-10 (the length of the semiconductor substrate 21-10 in the up-and-down direction in FIG. 10) and the thickness of the semiconductor substrate 31-10 (the length of the semiconductor substrate 31-10 in the up-and-down direction in FIG. 10) are substantially the same as each other.

The substrate 100-10 and the first chip 20-10 are stacked such that the wiring layer 160-10 included in the substrate 100-10 faces the wiring layer 22-10 included in the first chip 20-10, and the substrate 100-10 and the second chip 30-10 are stacked such that the wiring layer 160-10 included in the substrate 100-10 faces the wiring layer 32-10 included in the second chip 30-10. Through vias 778-1 and 778-2 that each pass through the substrate 100-10 are formed in the substrate 100-10. The through vias 778-1 and 778-2 each include a thermally conductive material made of, for example, copper (Cu). A first guard ring 2-10 is formed on an outer portion of the wiring layer 22-10 included in the first chip 20-10 (at left and right ends of the wiring layer 22-10 in FIG. 10), and the first guard ring 2-10 is connected to the semiconductor substrate 21-10. Further, a second guard ring 3-10 is formed on an outer portion of the wiring layer 32-10 included in the second chip 30-10 (at left and right ends of the wiring layer 32-10 in FIG. 10), and the second guard ring 3-10 is connected to the semiconductor substrate 31-10. A portion of the first guard ring 2-10 of the first chip 20-10 that is formed on a side adjacent to the second chip 30-10 (on the right in FIG. 10), and a portion of the second guard ring 3-10 of the second chip 30-10 that is formed on a side adjacent to the first chip 20-10 (on the left in FIG. 8A) are connected to each other through the through vias 778-1 and 778-2 each including a thermally conductive material. Further, the through vias 778-1 and 778-2 are connected to thermal conductive wiring 450. Thus, the semiconductor substrate 21-10, the first guard ring 2-10, the through via 778-1, the wiring 450, the through via 778-2, the second guard ring 3-10, and the semiconductor substrate 31-10 are connected to each other. This may result in reducing a difference in temperature between the first chip 20-10 and the second chip 30-10.

Note that, in addition to the contents described above, the contents described with respect to the semiconductor apparatuses of the first to seventh embodiments according to the present technology described above, and the contents described with respect to the semiconductor apparatus of the ninth embodiment according to the present technology described later can be applied to the semiconductor apparatus of the eighth embodiment according to the present technology with no change, unless there is a technical inconsistency in particular.

10. Ninth Embodiment (Ninth Example of Semiconductor Apparatus)

The semiconductor apparatus of the ninth embodiment according to the present technology (a ninth example of the semiconductor apparatus) is described using FIG. 11. FIG. 11 illustrates an example of a configuration of the semiconductor apparatus of the ninth embodiment according to the present technology. Specifically, FIG. 11 is a cross-sectional view of a semiconductor apparatus 1-11 of the ninth embodiment according to the present technology.

First, the description is made using FIG. 11. The semiconductor apparatus 1-11 includes a substrate 100-11, a first chip 20-11 and a second chip 30-11 that are each stacked on the substrate 100-11 (stacked downward in FIG. 9), and a substrate 110-11 that is stacked on the substrate 100-11 (stacked upward in FIG. 9). In other words, in the semiconductor apparatus 1-11, the substrate 110-11, the substrate 100-11, and the first chip 20-11 and the second chip 30-11 are arranged in this order from above in FIG. 11.

The substrate 100-11 includes a signal processing circuit. Specifically, the substrate 100-11 includes a semiconductor substrate 150-11 in which a signal processing circuit such as a logic circuit is formed, and a wiring layer 160-11 that is formed on the semiconductor substrate 150-11. Further, a semiconductor substrate 170-11 included in the substrate 110-11 is formed above the wiring layer 160-11, and a wiring layer 180-11 included in the substrate 110-11 is formed on the semiconductor substrate 170. A signal processing circuit such as a memory circuit is formed in the semiconductor substrate 170-11. The first chip 20-11 includes a semiconductor substrate 21-11 and a wiring layer 22-11, and a signal processing circuit such as a logic circuit is formed in the semiconductor substrate 21-11. Further, the second chip 30-11 includes a semiconductor substrate 31-11 and a wiring layer 32-11, and a signal processing circuit such as a memory circuit is formed in the semiconductor substrate 31-11. In FIG. 11, the first chip 20-11 and the second chip 30-11 are formed downward on the substrate 100-11 in substantially the same layer (at the same level), where the thickness of the wiring layer 22-11 (the length of the wiring layer 22-11 in an up-and-down direction in FIG. 11) and the thickness of the wiring layer 32-11 (the length of the wiring layer 32-11 in the up-and-down direction in FIG. 11) are substantially the same as each other, and the thickness of the semiconductor substrate 21-11 (the length of the semiconductor substrate 21-11 in the up-and-down direction in FIG. 11) and the thickness of the semiconductor substrate 31-11 (the length of the semiconductor substrate 31-11 in the up-and-down direction in FIG. 11) are substantially the same as each other.

A thermally conductive material 4-11 made of, for example, copper (Cu) is formed in the wiring layer 160-11 included in the substrate 100-11. A first guard ring 2-11 is formed on an outer portion of the wiring layer 22-11 included in the first chip 20-11 (at left and right ends of the wiring layer 22-11 in FIG. 11), and the first guard ring 2-11 is connected to the semiconductor substrate 21-11. Further, a second guard ring 3-11 is formed on an outer portion of the wiring layer 32-11 included in the second chip 30-11 (at left and right ends of the wiring layer 32-11 in FIG. 11), and the second guard ring 3-11 is connected to the semiconductor substrate 31-11. A portion of the first guard ring 2-11 of the first chip 20-11 that is formed on a side adjacent to the second chip 30-11 (on the right in FIG. 11), and a portion of the second guard ring 3-11 of the second chip 30-11 that is formed on a side adjacent to the first chip 20-11 (on the left in FIG. 8A) are connected to each other through the thermally conductive material 4-11. In other words, as illustrated in FIG. 11, the portion of the first guard ring 2-11 that is situated on the right in FIG. 11 and on the side adjacent to the second chip 30-11, a thermally conductive bump 470-1, a via 779-1, and the thermally conductive material 4-11 are connected to each other in this order. The portion of the second guard ring 3-11 that is situated on the left in FIG. 11 and on the side adjacent to the first chip 20-11, a thermally conductive bump 470-2, a via 779-2, and the thermally conductive material 4-11 are connected to each other in this order. Thus, the semiconductor substrate 21-11, the first guard ring 2-11, the thermally conductive material 4-11-1, the second guard ring 3-11, and the semiconductor substrate 31-11 are connected to each other through the bumps 470-1 and 470-2 and the vias 779-1 and 779-2. This may result in reducing a difference in temperature between the first chip 20-11 and the second chip 30-11.

Note that, in addition to the contents described above, the contents described with respect to the semiconductor apparatuses of the first to eighth embodiments according to the present technology described above can be applied to the semiconductor apparatus of the ninth embodiment according to the present technology with no change, unless there is a technical inconsistency in particular.

11. Tenth Embodiment (Example of Electronic Apparatus)

An electronic apparatus of a tenth embodiment according to the present technology is an electronic apparatus that includes one of the semiconductor apparatuses of the first to ninth embodiments according to the present technology.

Figure 17:
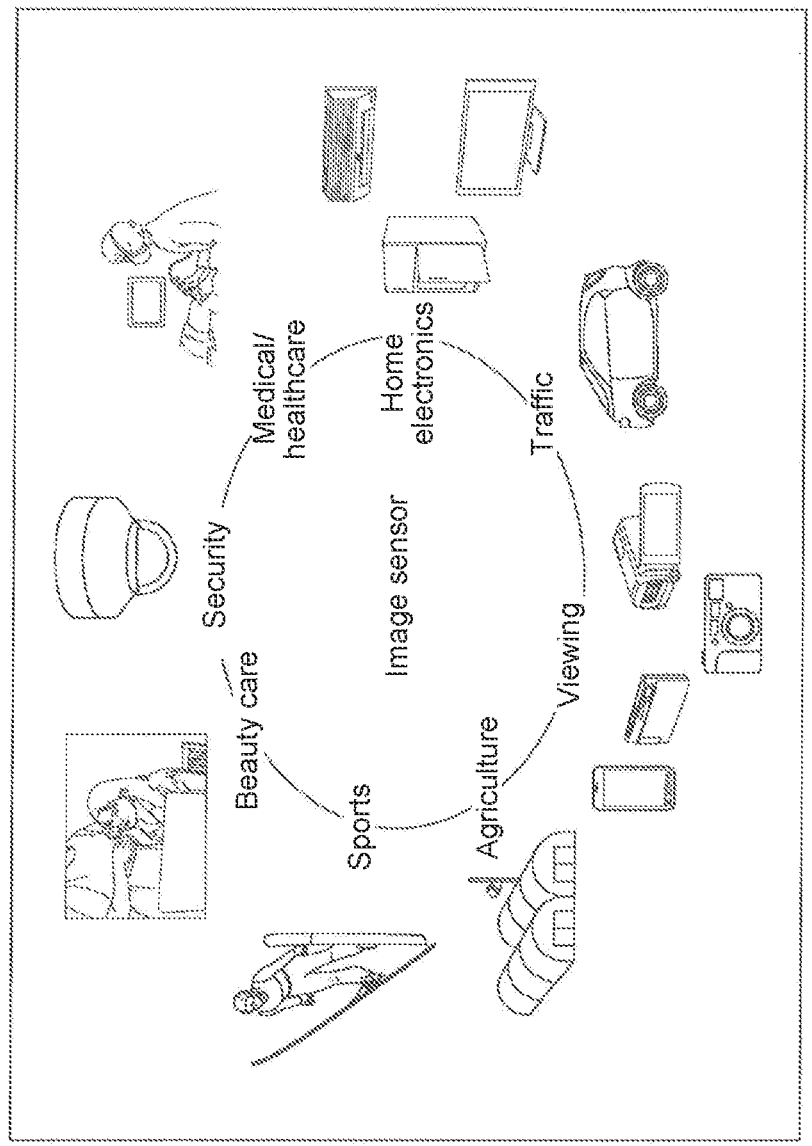

12. Example of Using Semiconductor Apparatus to which Present Technology is Applied FIG. 17 illustrates an example of using the semiconductor apparatuses of the first to ninth embodiments according to the present technology each corresponding to an image sensor (a solid-state imaging apparatus) that is an example of a semiconductor apparatus.

For example, the semiconductor apparatuses of the first to ninth embodiments described above can be used in various cases of sensing light such as visible light, infrared light, ultraviolet light, and X-rays, as indicated below. In other words, as illustrated in FIG. 17, one of the semiconductor apparatuses of the first to ninth embodiments can be used for an apparatus (for example, the electronic apparatus of the tenth embodiment described above) that is used in, for example, a field of viewing in which an image for viewing is captured, a field of traffic, a field of home electronics, a medical/healthcare field, a field of security, a field of beauty care, a field of sports, and a field of agriculture.

Specifically, in the field of viewing, one of the semiconductor apparatuses of the first to ninth embodiments can be used for an apparatus that is used to capture an image for viewing. Examples of the apparatus used to capture an image for viewing include a digital camera, a smartphone, and a cellular phone with a camera function.

In the field of traffic, one of the semiconductor apparatuses of the first to ninth embodiments can be used for an apparatus used for traffic, in order to, for example, drive safely by automatic stopping or the like, and recognize a state of a driver. Examples of the apparatus used for traffic include an in-vehicle sensor that captures, for example, images of regions ahead of and behind an automobile, an image of the surroundings of the automobile, and an image of the inside of the automobile; a monitoring camera that monitors a travelling vehicle and a road; and a ranging sensor that measures a distance between vehicles.

In the field of home electronics, one of the semiconductor apparatuses of the first to ninth embodiments can be used for an apparatus used for home electronics such as a television set, a refrigerator, and an air-conditioner, in order to, for example, capture an image of a gesture of a user, and perform an apparatus operation according to the gesture.

In the medical/healthcare field, one of the semiconductor apparatuses of the first to ninth embodiments can be used for an apparatus for medical/healthcare use, such as an endoscope, and an apparatus that performs angiography using reception of infrared light.

In the field of security, one of the semiconductor apparatuses of the first to ninth embodiments can be used for an apparatus used for security, such as a surveillance camera and a personal authentication camera.

In the field of beauty care, one of the semiconductor apparatuses of the first to ninth embodiments can be used for an apparatus used for beauty care, such as a skin measuring apparatus that captures an image of a skin, and a microscope that captures an image of a scalp.

In the field of sports, one of the semiconductor apparatuses of the first to ninth embodiments can be used for an apparatus used for sports, such as an action camera and a wearable camera that are used for sports.

In the field of agriculture, one of the semiconductor apparatuses of the first to ninth embodiments can be used for an apparatus used for agriculture, such as a camera used to monitor a state of a farm and a crop.

Figure 18:
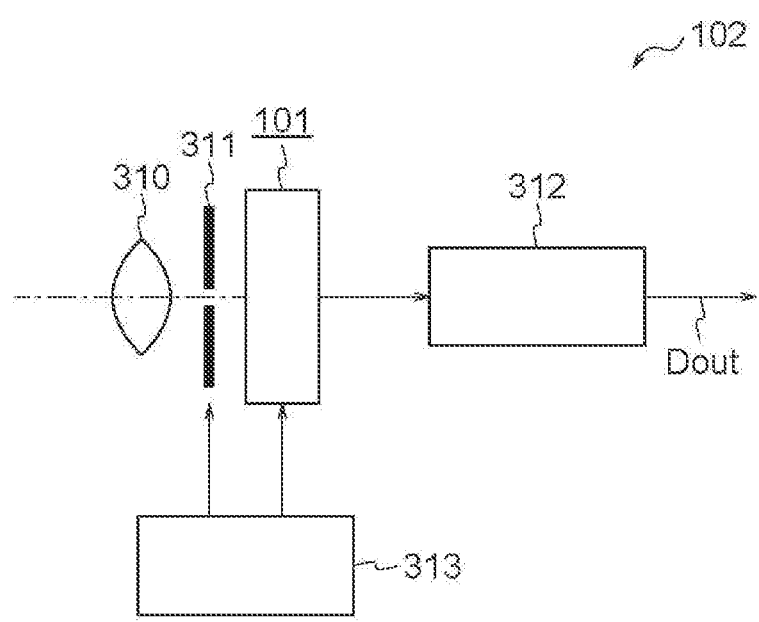

Next, the example of using the semiconductor apparatuses of the first to ninth embodiments according to the present technology is specifically described. For example, one of the semiconductor apparatuses of the first to ninth embodiments described above is used in the form of a solid-state imaging apparatus. Specifically, one of the semiconductor apparatuses of the first to ninth embodiments described above in the form of a solid-state imaging apparatus 101 can be applied to all types of electronic apparatuses including an image-capturing function, such as a camera system such as a digital still camera and a video camera, and a cellular phone including an image-capturing function. FIG. 18 illustrates a schematic configuration of an electronic apparatus 102 (camera) as an example of the electronic apparatus including an image-capturing function. For example, the electronic apparatus 102 is a video camera that can capture a still image or a moving image, and includes the solid-state imaging apparatus 101, an optical system (optical lens) 310, a shutter apparatus 311, a drive section 313 that drives the solid-state imaging apparatus 101 and the shutter apparatus 311, and a signal processor 312.

The optical system 310 guides image light (incident light) from a subject to a pixel section 101a of the solid-state imaging apparatus 101. The optical system 310 may include a plurality of optical lenses. The shutter apparatus 311 controls a period of time for irradiating light onto the solid-state imaging apparatus 101, and a period of time for shielding the solid-state imaging apparatus 101 from light. The drive section 313 controls a transfer operation performed by the solid-state imaging apparatus 101, and a shutter operation performed by the shutter apparatus 311. The signal processor 312 performs various kinds of signal processing with respect to a signal output from the solid-state imaging apparatus 101. A video signal Dout obtained by performing the signal processing is stored in a storage medium such as a memory, or is output to, for example, a monitor.

13. Example of Application to Endoscopic Surgery System

The present technology can be applied to various products. For example, the technology according to the present disclosure (the present technology) may be applied to an endoscopic surgery system.

Figure 19:
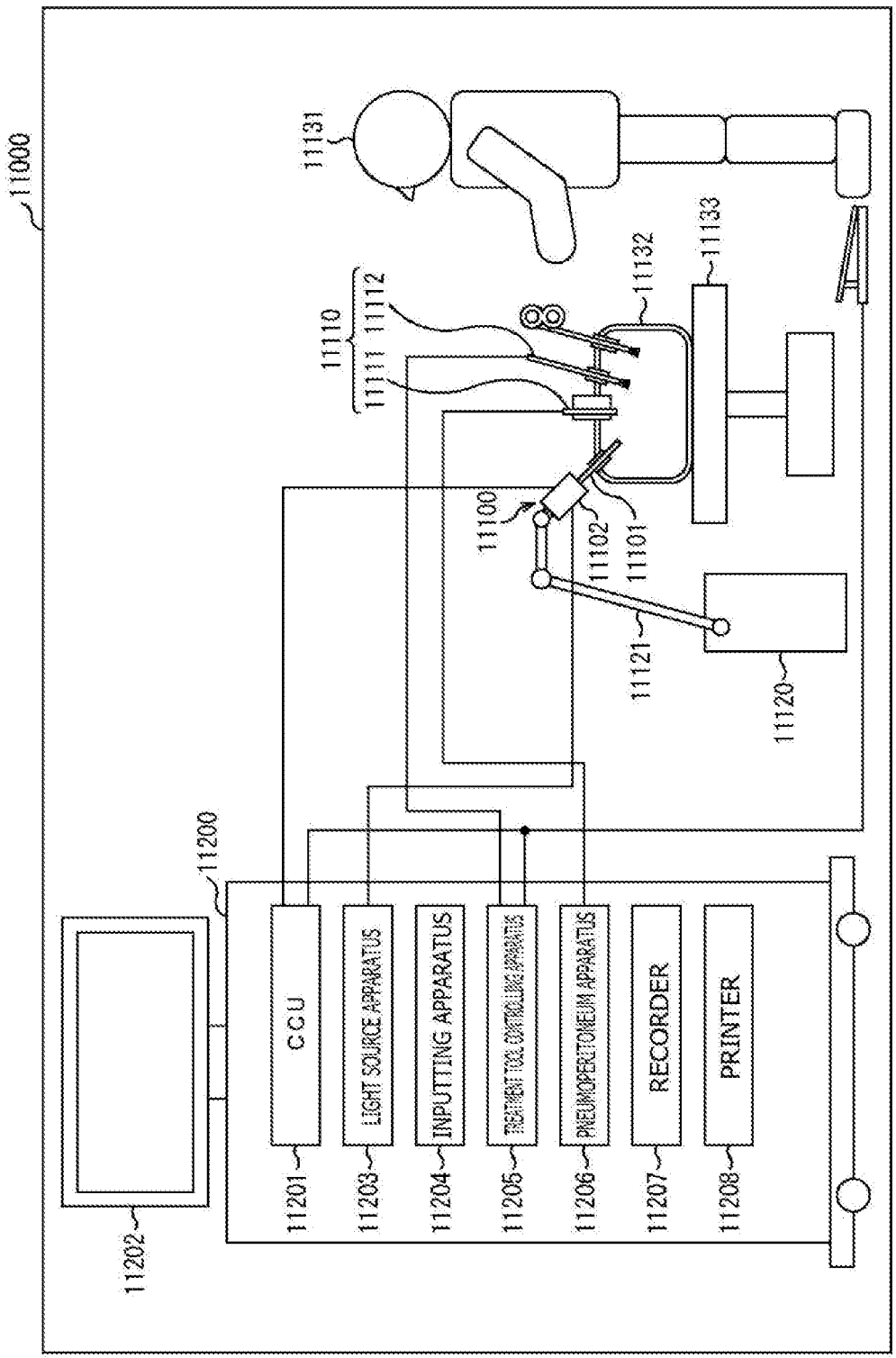

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 20:
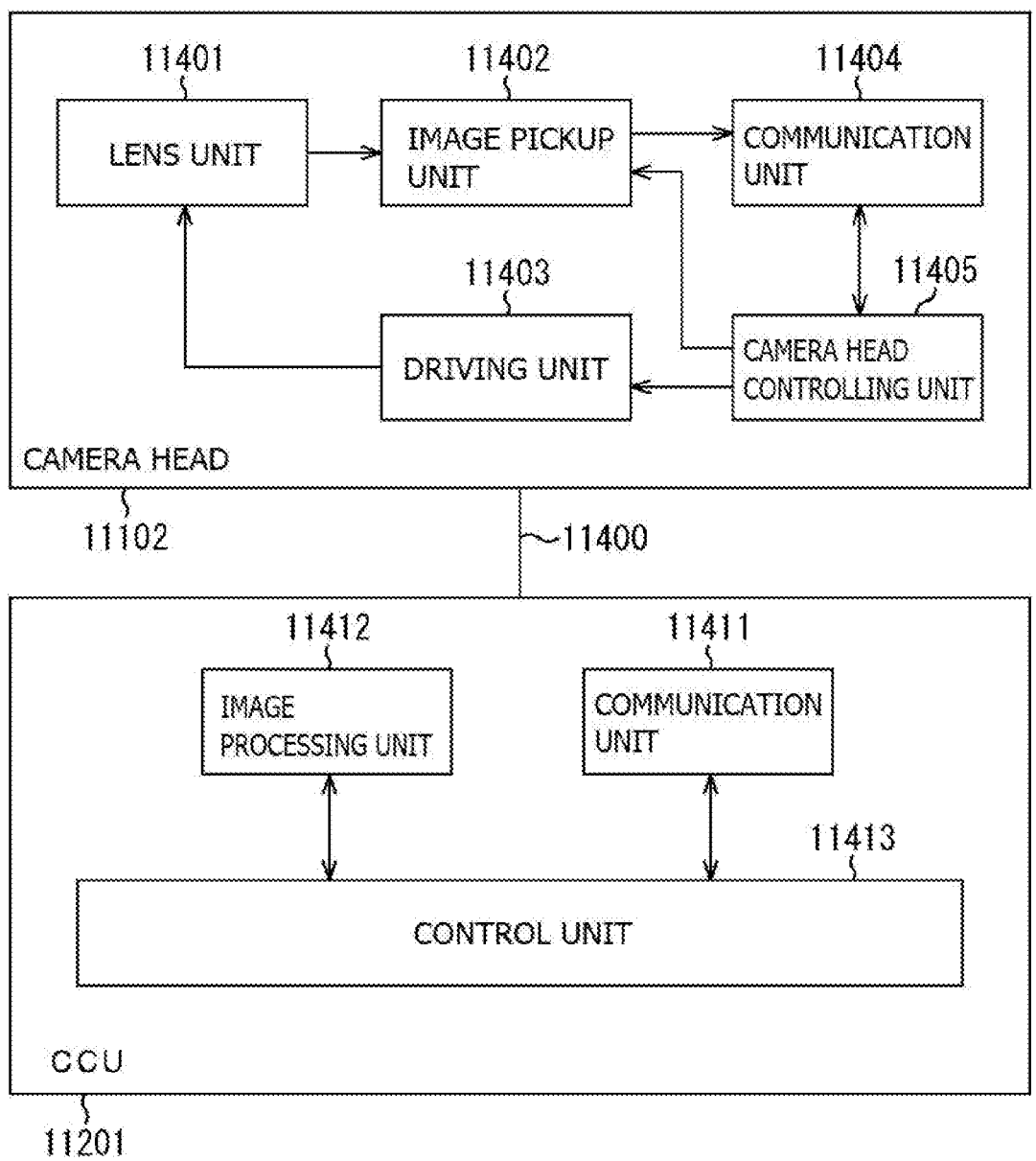

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes the image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure can be applied has been described above. The technology according to the present disclosure can be applied to the endoscope 11100 and (the image pickup unit 11402 of) the camera head 11102 from among the configurations described above. Specifically, a solid-state imaging apparatus that is an example of the semiconductor apparatus according to the present technology can be applied to, for example, the image pickup unit 10402. The application of the technology according to the present disclosure to, for example, the endoscope 11100 and (the image pickup unit 11402 of) the camera head 11102 makes it possible to improve the quality and the reliability of, for example, the endoscope 11100 and (the image pickup unit 11402 of) the camera head 11102.

The endoscopic surgery system has been described above as an example. Further, the technology according to the present disclosure may be applied to, for example, a microscopic surgery system.

14. Example of Application to Mobile Body

The technology according to the present disclosure (the present technology) can be applied to various products. For example, the technology according to the present disclosure may be provided as an apparatus that is included in one of the types of mobile bodies such as vehicle, electric vehicle, hybrid electric vehicle, motorcycle, bicycle, personal mobility, airplane, drone, ship, and robot.

Figure 21:
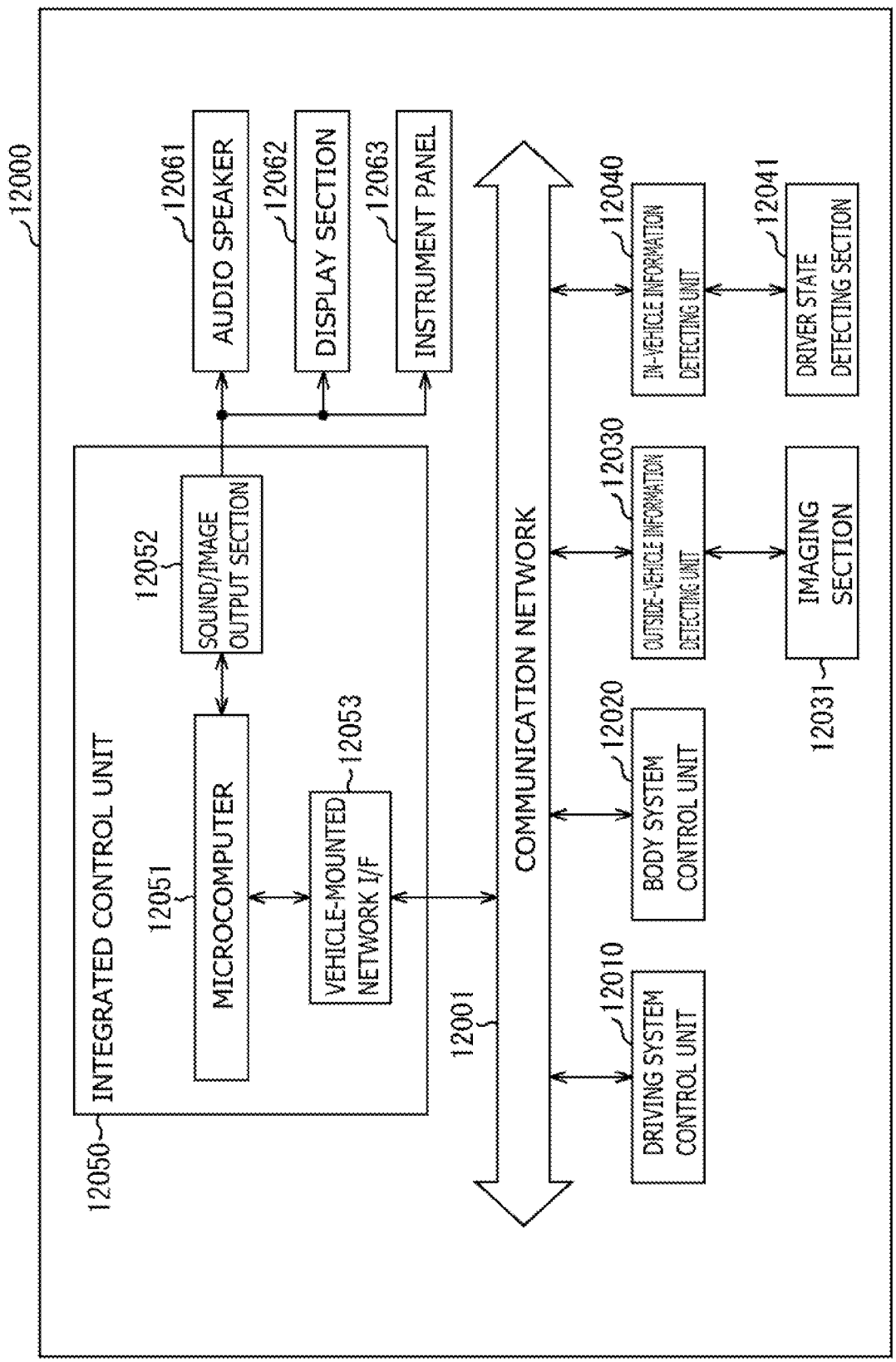

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

Figure 22:
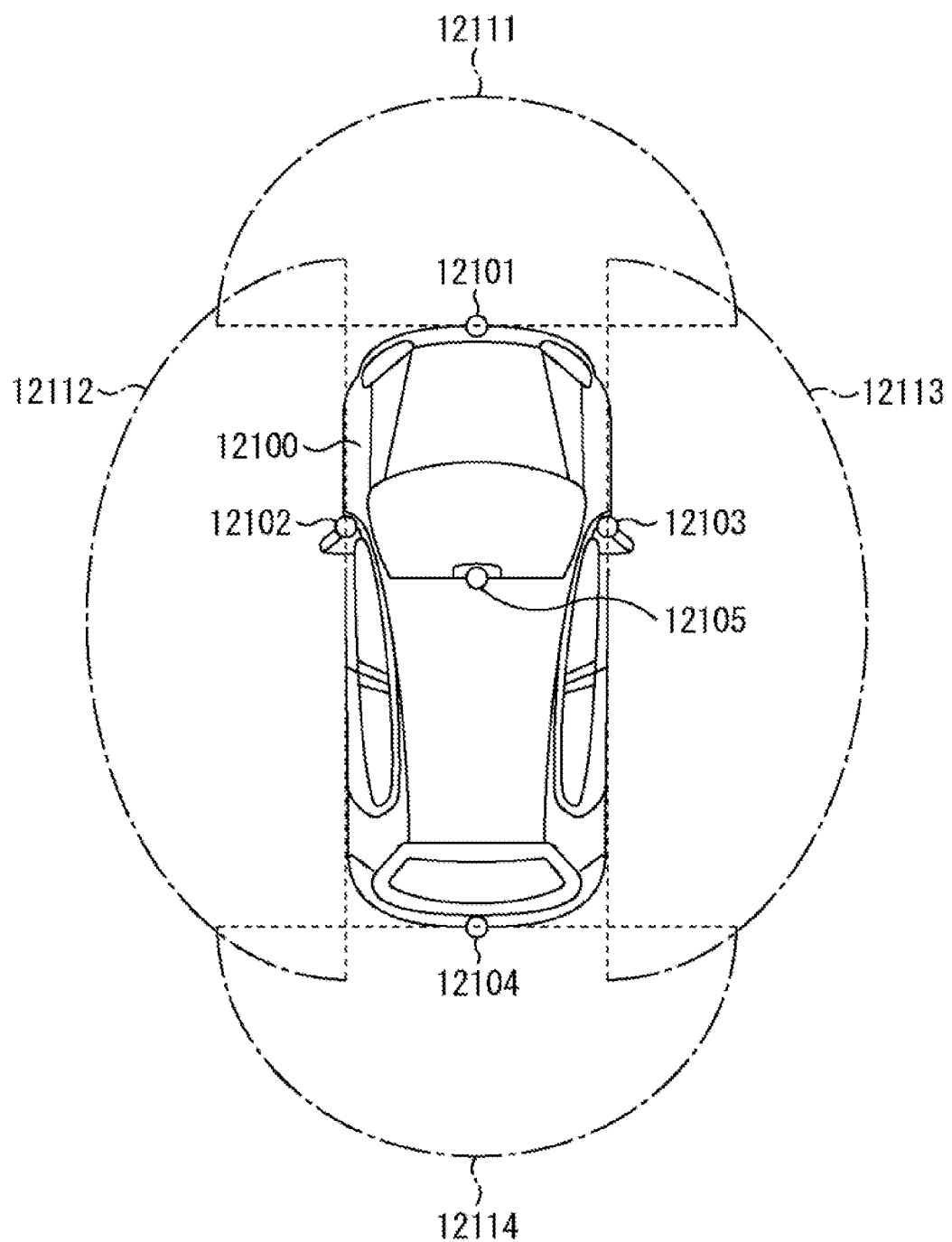

FIG. 22 is a diagram depicting an example of the installation position of the imaging section 12031.

In FIG. 22, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front that are obtained by the imaging sections 12101 and 12105 are used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure (the present technology) can be applied has been described above. The technology according to the present disclosure can be applied to, for example, the imaging section 12031 from among the configurations described above. Specifically, a solid-state imaging apparatus that is an example of the semiconductor apparatus according to the present technology can be applied to the imaging section 12031. The application of the technology according to the present disclosure to the imaging section 12031 makes it possible to improve the quality and the reliability of the imaging section 12031.

Note that the present technology is not limited to the embodiments, the use examples, and the application examples described above, and various modifications may be made thereto without departing from the scope of the present technology.

Further, the effects described herein are not limitative but are merely illustrative, and other effects may be provided.

Furthermore, the present technology may also take the following configurations.

[1] A semiconductor apparatus, including:
 a substrate;
 a plurality of chips each stacked on the substrate; and
 a plurality of guard rings each formed on an outer peripheral portion of a corresponding one of the plurality of chips to surround the corresponding one of the plurality of chips, in which
 at least portions of at least two of the plurality of guard rings are connected to each other through a thermally conductive material.
[2] The semiconductor apparatus according to [1], in which
 the thermally conductive material is formed in the substrate.
[3] The semiconductor apparatus according to [1] or [2], in which
 a nitride film is arranged between at least two of the plurality of chips that are adjacent to each other.
[4] The semiconductor apparatus according to any one of [1] to [3], in which
 the thermally conductive material is connected to dummy wiring that is formed in the chip surrounded by at least one of the at least two of the plurality of guard rings.
[5] The semiconductor apparatus according to any one of [1] to [4], in which
 the thermally conductive material is connected to dummy wiring that is formed in the substrate.
[6] The semiconductor apparatus according to any one of [1] to [5], in which
 the thermally conductive material is connected to metal wiring that is formed in the substrate.
[7] The semiconductor apparatus according to any one of [1] to [6], in which
 the at least portions of the at least two of the plurality of guard rings are connected to each other through through vias that each pass through the substrate, and
 the through via includes the thermally conductive material.
[8] The semiconductor apparatus according to any one of [1] to [7], in which
 the at least portions of the at least two of the plurality of guard rings are connected to each other through the thermally conductive material and bumps.

[9] The semiconductor apparatus according to any one of [1] to [8], in which each of the plurality of chips includes a semiconductor substrate, and the semiconductor substrate is connected to the guard ring.

[10] The semiconductor apparatus according to any one of [1] to [9], in which the thermally conductive material includes at least one type selected from carbon nanotube, diamond, silver, copper, gold, aluminum, silicon, carbon, and aluminum nitride.

[11] The semiconductor apparatus according to any one of [1] to [10], in which the substrate includes an imaging device that generates a pixel signal for each pixel, and at least one of the plurality of chips includes a signal processing circuit used to perform signal processing on the pixel signal.

[12] The semiconductor apparatus according to any one of [1] to [10], in which the substrate includes a signal processing circuit, and at least one of the plurality of chips includes a signal processing circuit.

[13] The semiconductor apparatus according to any one of [1] to [12], in which the plurality of chips includes a first chip and a second chip, the plurality of guard rings includes a first guard ring and a second guard ring, the first guard ring is formed on an outer peripheral portion of the first chip to surround the first chip, the second guard ring is formed on an outer peripheral portion of the second chip to surround the second chip, and the first guard ring and the second guard ring are connected to each other through the thermally conductive material.

[14] The semiconductor apparatus according to any one of [1] to [12], in which the plurality of chips includes a first chip, a second chip, and a third chip, the plurality of guard rings includes a first guard ring, a second guard ring, and a third guard ring, the first guard ring is formed on an outer peripheral portion of the first chip to surround the first chip, the second guard ring is formed on an outer peripheral portion of the second chip to surround the second chip, the third guard ring is formed on an outer peripheral portion of the third chip to surround the third chip, the first guard ring and the second guard ring are connected to each other through a first thermally conductive material, and the second guard ring and the third guard ring are connected to each other through a second thermally conductive material.

[15] An electric apparatus, including the semiconductor apparatus according to any one of [1] to [14].

REFERENCE SIGNS LIST 1 (1-1a, 1-1b, 1-2a, 1-2b, 1-3a, 1-3b, 1-4a, 1-4b, 1-5a, 1-6a, 1-6b, 1-7a, 1-7b, 1-8a, 1-8b, 1-9, 1-10, 1-15, 1-16a, 1-16b) semiconductor apparatus (solid-state imaging apparatus)
1 (1-11) semiconductor apparatus
2 (2-1a, 2-1b, 2-2a, 2-2b, 2-3a, 2-3b, 2-4a, 2-4b, 2-5a, 2-5b, 2-6a, 2-6b, 2-7a, 2-7b, 2-8a, 2-9, 2-10, 2-11, 2-15) first guard ring
3 (3-1a, 3-1b, 3-2a, 3-2b, 3-3a, 3-3b, 3-4a, 3-4b, 3-5a, 3-5b, 3-6a, 3-6b, 3-7a, 3-7b, 3-8a, 3-9, 3-10, 3-11, 3-15) second guard ring
4 (4-1a, 4-1b, 4-2a, 4-2b, 4-3a, 4-3b, 4-4a, 4-4b, 4-5a, 4-5b, 4-6a-1, 4-6a-2, 4-6b-1, 4-6b-2, 4-6b-3, 4-6b-4, 4-6b-5, 4-6b-6, 4-7a-1, 4-7a-2, 4-7a-3, 4-7a-4, 4-7a-5, 4-7b-1, 4-7b-2, 4-7b-3, 4-7b-4, 4-7b-5, 4-8a-1, 4-8a-2, 4-8a-3, 4-8b-1, 4-8b-3, 4-8b-3, 4-9-1, 4-11, 4-13, 4-14, 4-15, 4-16a) thermally conductive material
20 (20-1a, 20-1b, 20-2a, 20-2b, 20-3a, 20-3b, 20-4a, 20-4b, 20-5a, 20-5b, 20-6a, 20-6b, 20-7a, 20-7b, 20-8a, 20-8b, 20-9, 20-10, 20-11, 20-15, 20-16a) first chip
23 (23-6a, 23-6b), 32 (32-7b) second guard ring
30 (30-1a, 30-1b, 30-2a, 30-2b, 30-3a, 30-3b, 30-4a, 30-4b, 30-5a, 30-5b, 30-6a, 30-6b, 30-7a, 30-7b, 30-8a, 30-8b, 30-9, 30-10, 30-11, 30-15, 30-16a) second chip
40 (40-6a, 40-6b), 50 (50-7b) third chip
100 (100-2b, 100-3a, 100-4a, 100-5a, 100-6a, 100-7a, 100-8a, 100-9, 100-10, 100-11, 100-15, 100-16a) substrate
778 (778-1, 778-2) through via (thermally conductive material)

The invention claimed is:

1. A semiconductor apparatus, comprising:
a substrate;
a plurality of chips each stacked on the substrate; and
a plurality of guard rings each formed on an outer peripheral portion of a corresponding one of the plurality of chips to surround the corresponding one of the plurality of chips, wherein
at least portions of at least two of the plurality of guard rings are connected to each other through a thermally conductive material, and
a nitride film is arranged between at least two of the plurality of chips that are adjacent to each other.

2. The semiconductor apparatus according to claim 1, wherein the thermally conductive material is formed in the substrate.

3. The semiconductor apparatus according to claim 1, wherein
the thermally conductive material is connected to dummy wiring that is formed in a chip surrounded by at least one of the at least two of the plurality of guard rings.

4. The semiconductor apparatus according to claim 1, wherein
the thermally conductive material is connected to dummy wiring that is formed in the substrate.

5. The semiconductor apparatus according to claim 1, wherein
the thermally conductive material is connected to metal wiring that is formed in the substrate.

6. The semiconductor apparatus according to claim 1, wherein
the at least portions of the at least two of the plurality of guard rings are connected to each other through through vias that each pass through the substrate, and
the through via includes the thermally conductive material.

7. The semiconductor apparatus according to claim 1, wherein
the at least portions of the at least two of the plurality of guard rings are connected to each other through the thermally conductive material and bumps.

8. The semiconductor apparatus according to claim 1, wherein
each of the plurality of chips includes a semiconductor substrate, and
the semiconductor substrate is connected to the at least two of the plurality of guard rings.

9. The semiconductor apparatus according to claim 1, wherein
the thermally conductive material includes one of carbon nanotube, diamond, silver, copper, gold, aluminum, silicon, carbon, or aluminum nitride.

10. The semiconductor apparatus according to claim 1, wherein
the substrate includes an imaging device that generates a pixel signal for each pixel, and
at least one of the plurality of chips includes a signal processing circuit used to perform signal processing on the pixel signal.

11. The semiconductor apparatus according to claim 10, further comprising:
a color filter formed on the imaging device; and
an on-chip lens formed on the imaging device.

12. The semiconductor apparatus according to claim 1, wherein
the substrate includes a signal processing circuit, and
at least one of the plurality of chips includes a signal processing circuit.

13. The semiconductor apparatus according to claim 1, wherein
the plurality of chips includes a first chip and a second chip,
the plurality of guard rings includes a first guard ring and a second guard ring,
the first guard ring is formed on an outer peripheral portion of the first chip to surround the first chip,
the second guard ring is formed on an outer peripheral portion of the second chip to surround the second chip, and
the first guard ring and the second guard ring are connected to each other through the thermally conductive material.

14. A semiconductor apparatus, comprising:
a substrate;
a plurality of chips, each stacked on the substrate, includes a first chip, a second chip, and a third chip; and
a plurality of guard rings which includes a first guard ring, a second guard ring, and a third guard ring, wherein
the first guard ring is formed on an outer peripheral portion of the first chip to surround the first chip,
the second guard ring is formed on an outer peripheral portion of the second chip to surround the second chip,
the third guard ring is formed on an outer peripheral portion of the third chip to surround the third chip,
the first guard ring and the second guard ring are connected to each other through a first thermally conductive material, and
the second guard ring and the third guard ring are connected to each other through a second thermally conductive material.

15. An electric apparatus, comprising:
the semiconductor apparatus according to claim 1.

16. The semiconductor apparatus according to claim 1, wherein
each of the plurality of chips includes a semiconductor substrate,
a support substrate, different from the substrate and the semiconductor substrate, is stacked under the at least two of the plurality of chips, and
the nitride film is arranged between each of the at least two of the plurality of chips and the support substrate.

17. The semiconductor apparatus according to claim 1, wherein
the substrate includes a first wiring layer, and
each of the at least two of the plurality of chips includes a second wiring layer.

* * * * *